(12) United States Patent
Bellini et al.

(10) Patent No.: US 10,355,117 B2
(45) Date of Patent: Jul. 16, 2019

(54) PHASE CONTROL THYRISTOR

(71) Applicant: ABB Schweiz AG, Baden (CH)

(72) Inventors: Marco Bellini, Schlieren (CH); Jan Vobecky, Lenzburg (CH)

(73) Assignee: ABB Schweiz AG, Baden (CH)

( * ) Notice: Subject to any disclaimer, the term of this patent is extended or adjusted under 35 U.S.C. 154(b) by 36 days.

(21) Appl. No.: 15/421,128

(22) Filed: Jan. 31, 2017

(65) Prior Publication Data

US 2017/0243966 A1    Aug. 24, 2017

Related U.S. Application Data

(63) Continuation of application No. PCT/EP2015/067653, filed on Jul. 31, 2015.

(30) Foreign Application Priority Data

Jul. 31, 2014   (EP) .................................... 14179320

(51) Int. Cl.
*H01L 29/74* (2006.01)
*H01L 29/08* (2006.01)
*H01L 29/66* (2006.01)

(52) U.S. Cl.
CPC ...... *H01L 29/7428* (2013.01); *H01L 29/0839* (2013.01); *H01L 29/66363* (2013.01); *H01L 29/74* (2013.01)

(58) Field of Classification Search
CPC ..................... H01L 29/66363; H01L 29/0839
See application file for complete search history.

(56) References Cited

U.S. PATENT DOCUMENTS

| 4,150,390 A | 4/1979 | Jaecklin |
| 4,760,438 A | 7/1988 | Tursky |
| (Continued) | | |

FOREIGN PATENT DOCUMENTS

| DE | 3744308 A1 | 7/1989 |
| FR | 2178931 A1 | 11/1973 |
| (Continued) | | |

OTHER PUBLICATIONS

European Patent Office, International Search Report & Written Opinion issued in corresponding Application No. PCT/EP2015/067653, dated Oct. 20, 2015, 17 pp.

(Continued)

*Primary Examiner* — Mohammed R Alam
(74) *Attorney, Agent, or Firm* — Taft Stettinius & Hollister LLP; J. Bruce Schelkopf

(57) ABSTRACT

A thyristor is disclosed with a plurality of emitter shorts at points in the cathode region. The points define a Delaunay triangulation with a plurality of triangles. For a first subset of triangles a coefficient of variation of the values $q_{T,l}$ with $l \in S_1$ is smaller than 0.1, and/or an absolute value of a skewedness of the geometric quantities $q_{T,l}$ with $l \in S_1$ is smaller than 5, and/or a Kurtosis of the geometric quantities $q_{T,l}$ with $l \in S_1$ is smaller than 20. For a second subset of triangles, a quotient of a standard deviation of the quantities $q_{T,m}$ with $m \in S_2$ and a mean squared value of the geometric quantity $q_{T,l}$ with $l \in S_1$ is less than 1, and/or a quotient of a number of triangles in the second subset and a number of triangles in the first subset is less than $1.0 \times 10^{-2}$.

19 Claims, 10 Drawing Sheets

(56) References Cited

U.S. PATENT DOCUMENTS

| | | | |
|---|---|---|---|
| 6,409,615 | B1 | 6/2002 | McGuire et al. |
| 7,845,079 | B2 | 12/2010 | McGuire |
| 9,142,656 | B2 | 9/2015 | Streit |
| 2013/0020303 | A1 | 1/2013 | Kim et al. |

FOREIGN PATENT DOCUMENTS

| | | |
|---|---|---|
| JP | S5374885 A | 7/1978 |
| JP | 55158671 A | 12/1980 |
| JP | S5649162 U | 5/1981 |
| JP | S5720470 A | 2/1982 |
| JP | 2004505735 A | 2/2004 |
| JP | 2004334154 A | 11/2004 |
| JP | 2009501617 A | 1/2009 |
| JP | 2013527561 A | 6/2013 |
| JP | 2013534051 A | 8/2013 |
| WO | 2011161097 A2 | 12/2011 |

OTHER PUBLICATIONS

European Patent Office, Extended Search Report issued in corresponding Application No. 14179320.8, dated Jan. 12, 2015, 9 pages.

Anonymous, "Delaunay triangulation," Wikipedia, the free encyclopedia, retrieved Jun. 23, 2014, https:/en.wikipedia.org/w/index.php?title=Delaunay_triangulation&oldid=614036873.

Anonymous, "Mesh generation," Wikipedia, the free encyclopedia, retrieved Jul. 29, 2014, https://en.wikipedia.org/w/index.php?title=Mesh_generation&oldid=618944988.

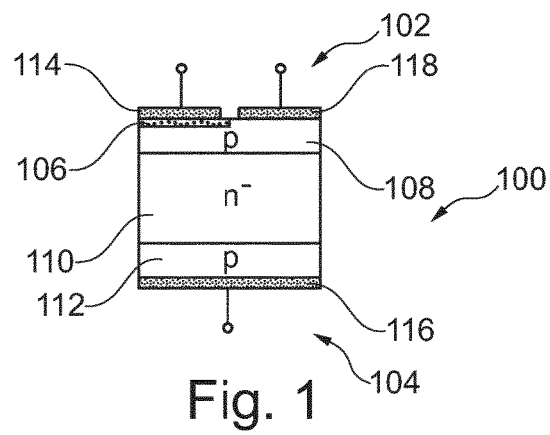
Fig. 1
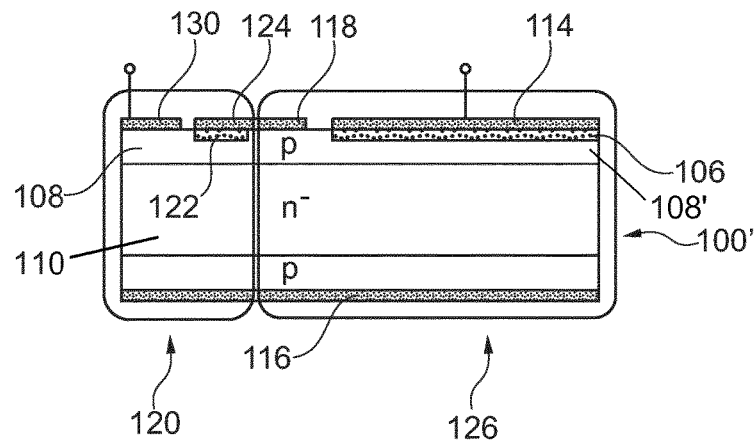
Fig. 2
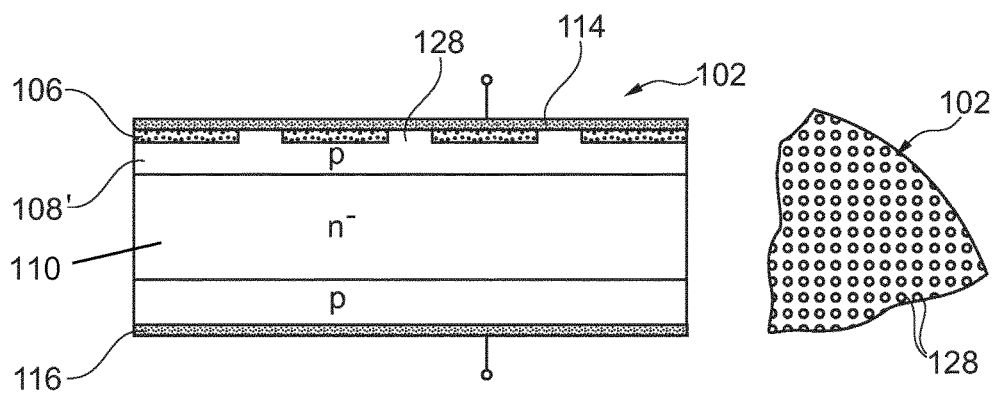 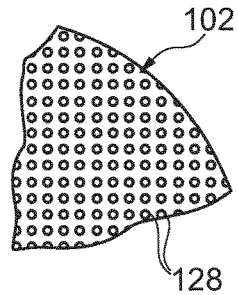
Fig. 3    Fig. 4

Prior Art

Prior Art

PHASE CONTROL THYRISTOR

TECHNICAL FIELD

The invention relates to a thyristor, in particular a phase control thyristor having a main gate structure as well as a plurality of discrete emitter shorts arranged on a cathode side of the thyristor, and to a method for manufacturing such a thyristor, in accordance with the independent patent claims.

BACKGROUND INFORMATION

A thyristor, sometimes also referred to as silicon controlled rectifier (SCR), is a switching device which can be turned on in a forward direction, i.e. when forward biased by a turn-on voltage and when a positive gate current is supplied to a gate terminal. The thyristor is then said to be in a forward conducting state or on state in which a current may flow in a forward direction from an anode to a cathode. On the other hand, the thyristor can also be in a forward blocking state, also referred to as off-state, meaning that a high positive voltage in the forward direction can be blocked. In a reverse direction opposite to the forward direction, the thyristor cannot be turned on. A thyristor may be reverse blocking, which means that it can block at least approximately the same voltage in the reverse direction as in the forward blocking state, or asymmetric, which means that it has virtually no blocking capability in the reverse direction. Since phase control applications commonly require reverse blocking capabilities, a phase control thyristor (PCT) is typically reverse blocking.

In what follows, some basic principles of phase controlled thyristors (PCT) and definitions of terms and wordings subsequently used throughout the description and patent claims will be given with regard to FIGS. 1-4.

FIG. 1 schematically shows a cross-section of a simple thyristor 100. The thyristor comprises a semiconductor slab, in particular a semiconductor waver or die, in which a thyristor structure comprising four layers of differently doped semiconducting material having alternating conduction types, i.e. an npnp-layer-stack structure, has been formed by methods known as such to a person skilled in the art. In an order from a cathode side 102 to an anode side 104 of the thyristor 100, the thyristor structure first comprises an (n+)-doped cathode emitter layer 106. Then, a p-doped base layer 108 and an (n–)-doped base layer 110 follow. Finally, at the anode side 104, a p-doped anode layer 112 is arranged. The (n+)-doped cathode emitter layer 106 is electrically contacted by a cathode metallization 114 formed on a cathode side surface of the semiconductor slab to adjoin said cathode emitter layer 106. The p-doped anode layer 112 is electrically contacted by an anode metallization 116 formed on an anode side surface of the semiconductor slab to adjoin said p-anode layer 112. The p-doped base layer 108 is electrically contacted by a gate metallization 118 formed on the cathode side surface of the semiconductor slab to adjoin said p-doped base layer 108.

A contact region between the cathode side surface and the cathode metallization 114 on the will be referred to as cathode region; a contact region on the cathode side surface between the p-doped base layer 108 and the gate metallization 118 as gate region.

When a positive voltage or forward voltage is applied between the anode metallization 116 (also referred to as anode in what follows for the sake of brevity) and the cathode metallization 114 (also briefly referred to as cathode in what follows), the thyristor 100 may be switched between the forward blocking state, and the forward conducting state. As long as no current is supplied to the gate metallization 118 (for the sake of brevity, also referred to as gate in what follows) the thyristor will remain in the blocking state. However, when the thyristor is triggered by supplying a current to the gate 118, electrons will be injected from the cathode, flow to the anode where they will lead to hole injection, and an electron-hole plasma will form in the p-doped base layer 108 and n-doped base layer 110 which may switch the thyristor 100 into the forward conducting state. The forward conducting state may be maintained as long as the forward voltage is applied and will only be stopped when the forward voltage applied between the anode metallization 116 and the cathode metallization 114 is switched off, or when the voltage applied between and cathode is reversed. Upon applying a reverse, negative voltage between the anode and the cathode, the thyristor goes into a reverse blocking state and may only be switched to the forward conducting state by re-triggering by again applying a forward voltage and a sufficient gate current. However, in order to obtain its full blocking capability, the reverse voltage has to be applied for a certain duration called quiescence time $t_q$ such that the electron-hole plasma previously injected may disappear due to recombination processes, thereby reenabling the forward blocking capacity of the device.

To trigger a thyristor 100 as shown in FIG. 1, a substantial gate current would be required. A known, simple remedy is the integration of an auxiliary thyristor 120, as well-known to persons skilled in the art, between a main gate (sometimes also referred to as amplifying gate) and an anode of a thyristor 100' as depicted in FIG. 2, said thyristor 100' further comprising a main thyristor 126. The auxiliary thyristor may alternatively be called a pilot thyristor. Therein, a pilot gate 130 (sometimes also referred to as auxiliary gate) contacts the p-doped base 108 in a region of the auxiliary thyristor 120. The auxiliary thyristor 120 also comprises an additional (n+)-doped emitter layer 122, also referred to as auxiliary (n+)-doped emitter layer. The auxiliary (n+)-doped emitter layer 122 is contacted by an additional cathode metallization 124 of the auxiliary thyristor. The additional cathode metallization 124 of the auxiliary thyristor 120 is internally connected to the gate metallization 118, also referred to as main gate metallization, which contacts the underlying p-doped base layer 108 in a region of the main thyristor 126, and wherein the contact region on the cathode side surface between the p-doped base layer 108' in the region of the main thyristor 126 and the main gate metallization is again referred to as gate region. Preferably, a single, contiguous metallization serves as both additional cathode metallization 124 and main gate metallization 118. An (n+)-doped emitter layer 106 is comprised in the main thyristor region 126 and is contacted by the cathode metallization 114 of the main thyristor, with a contact region between the cathode side surface and the cathode metallization 114 in the region of the main thyristor 126 again referred to as cathode region. Typically, the further cathode metallization 124 of the auxiliary thyristor 120 is not accessible from an outside of the thyristor 100'; i.e. no terminal exists which would allow for direct electric connection from the outside to the further cathode metallization 124.

Exemplarily, the pilot thyristor structure is integrated between pilot gate 130 and main thyristor 126. At the pilot gate the pilot thyristor has a further (n+)-doped emitter layer 122 and towards the main thyristor 126 a (p+)-doped emitter layer. These layers are connected to each other via a metallization. The (p+)-doped emitter layer acts as a short on the border for the additional (n+)-doped emitter layer 122. The current in the additional (n+)-doped emitter layer 122 is converted via the metallization to a hole current, which again acts as an injection current for the main thyristor 126. The (p+)-doped emitter layer carries the hole current, which injects the opposite section of the main thyristor 126. A circumferential (p+)-doped emitter layer is sufficient for this purpose. The charge spreading is achieved via the metallization.

Whereas a high gate overdrive factor, i.e. a ratio of utilized gate current and minimum gate trigger current, may speed up triggering of the thyristor 100', a further improvement may substantially help this process. As may be seen from FIG. 2, the triggered state of the main thyristor 126, i.e. the injected electron-hole plasma, starts at a boundary of the auxiliary thyristor 120 which conventionally might be a ring of about 1 cm diameter at a center of the thyristor 100'. The plasma then has to spread out to the whole thyristor area which may take several milliseconds. Only after this the thyristor will exhibit its steady on state forward voltage characteristic. To shorten the maximum distance to the area elements of the thyristor device, a distributed amplifying gate structure may be used. This implies that a gate region of the main thyristor may have a more complex shape, and may, for example, comprise a T-gate design, as shown in FIG. 5 of WO 2011/161097 A2, which is hereby included by reference in its entirety, and commonly used for large area PCTs. Such T-gate design may substantially shorten the distance for plasma spread so that the thyristor may be fully turned on by about 1 ms after the gate triggering pulse. Since plasma spread may be related to the time during which there is already substantially forward current and still high blocking voltage, this turn-on duration may have a strong influence on the turn-on energy loss.

For high power applications, thyristors have been developed based on round semiconductor wafers having a diameter $d_{wafer}$ of e.g. 4 or 5 inches. However, advanced thyristor applications require even larger thyristor designs based e.g. on 6 inch wafers. It has been observed that for such large thyristor designs, it may not be sufficient to simply scale-up previous smaller thyristor designs. With increasing thyristor diameter, further effects may gain influence on thyristor operation. For example, a larger thyristor for higher nominal current with equivalent forward blocking capacity or turn-on characteristics as well as cooling characteristics during thyristor operation may not simply be achieved by proportionally scaling thyristor dimensions.

In particular, thyristors having dimensions similar to the ones described above generally require gate regions of even more complicated shape and/or geometry than described further above. Frequently, the gate region comprises a plurality of longitudinal main gate beams extending from a center region of the cathode side surface 102 of the thyristor towards a circumferential region of said surface. Neighboring main gate beams are arranged with a distance with respect to an associated, imaginary intermediate middle line. Exemplary thyristor designs with such gate structures are again described in WO 2011/161097 A2.

In general, the cathode region for thyristors as described above completely surrounds the gate region, and thus has an at least essentially annular or ring-shaped topology. A boundary of the cathode region thus comprises an inner boundary and an outer boundary, with the outer boundary enclosing the inner boundary, and the inner boundary enclosing the gate region. In more mathematical terms, the outer boundary of the cathode region may be thought of as the shortest simple closed curve enclosing the cathode region, wherein a simple closed curve is a closed curve not crossing itself. The inner boundary of the cathode region, on the other hand, may be thought of as the longest simple closed curve enclosed by the outer boundary, but not enclosing any part of the cathode region. Alternatively, the cathode region may be regarded as a contiguous region with a, in particular exactly one, hole, said hole containing the gate region; wherein the inner boundary of the cathode region may be represented by the shortest simple closed curve enclosed by the outer boundary and enclosing the hole.

In a similar manner, an outer boundary of the gate region may be defined. While the outer boundary of the cathode region is frequently at least essentially of circular shape, or may be represented by a polygon having at least 20, preferably at least 100 edges and preferably approximating a circle, the inner boundary of the cathode region generally has a complicated shape resembling the outer boundary of the gate region. In particular, the inner boundary of the cathode region and the outer boundary of the gate region may be similar to one another in a geometric sense.

A thyristor 100' as described above with a homogeneously doped (n+)-doped cathode emitter layer 106 as shown in FIG. 2 may be very sensitive to transients with positive voltage variations dV/dt, which may give rise to so called dynamic voltage triggering, which is caused by a charging current occurring during build-up of a depletion layer in (n−)-base layer 110, which thus forms a drift region. Said charging current is amplified in a partial transistor formed by the emitter-, base- and drift-layers of the thyristor. Without impeding the forward characteristic significantly, this disadvantage may be mitigated by distributing a plurality of N discrete emitter shorts 128, generally with N>500, often N>1000 or N>2000, across at least a part of the cathode region. The main purpose of the emitter shorts 128 is to allow for removal of a leakage current which occurs during the forward blocking state of the thyristor, and which may lead to unintentional turning on of the thyristor, again due to current amplification in the partial transistor formed by emitter-, base- and drift-regions of the thyristor, especially at higher temperatures. The emitter shorts 128 are formed by small holes or throughs in the cathode emitter layer 106 through which the p-doped base layer 108 may reach the cathode side surface 102, metalized with the cathode metallization 114 as shown in FIG. 3. The p-doped regions with missing (n+)-doping on the cathode side 102 thus formed are sometimes also referred to cathode emitter shorts or cathode shorts as they may short-circuit the cathode junction. The emitter shorts 128 may form an ohmic short-circuit across a junction between p-doped base and (n+)-doped emitter, and may conduct a significant portion of the current at low current densities, i.e. in all phases where forward blocking is required. Therefore, undesired dV/dt triggering may be avoided in most practical cases. For given—or desired—forward blocking and/or dV/dt withstand capability, a maximum distance $d_{max}$ can be determined such that—ideally—no emitter short should be further than $d_{max}$ from its closest neighboring emitter short.

However, emitter shorts also have a various drawbacks. Most prominently, an effective area of the cathode region is reduced, thus increasing an on-state resistance, and as a consequence, an on-state voltage $V_T$. In particular, plasma expansion in a lateral direction, i.e. a direction parallel to the cathode side surface of the thyristor, is slowed down by the emitter shorts. This may lead to localized, high anode currents due to a fast rise of electric current in triggered regions of the thyristor occurring shortly after turn on; which in turn involves a risk of thermal overloading, and ultimately, destruction of the thyristor. As a consequence, a dI/dt capability of the thyristor is reduced. To limit the effects of this drawback, ideally no two emitter shorts should be closer than $d_{max}$ from one another.

From the two former requirements, it follows that an emitter shorts pattern of a thyristor as described above should be as uniform and homogenous as possible, ideally with a constant density of shorts over the whole cathode region, and all subregions thereof, in particular in cathode regions close to the gate structure.

For thyristors with simple gate region geometries and/or for parts of the cathode region distant from the gate region, this is in general relatively easy to achieve. As indicated in the top view of FIG. 4, the emitter shorts 128 may be provided in the form of small dots arranged in a regular pattern across the whole cathode region. Such a regular pattern may, e.g., be obtained by superposing a pattern of regularly arranged points over the cathode region as well as over a neighborhood adjoining said cathode region, and by subsequently selecting only those points which are located within the cathode region, and preferably having a given minimum distance from a boundary of said cathode region, and by arranging emitter shorts at the points thus selected. The emitter shorts 128 not only influence the axial triggering behavior, but a good shorts design may also yield a high lateral plasma spread velocity and may therefore result in a high permissible current variation dI/dt. It may be of high importance that there is no area of the cathode region where the shorts density gets below a minimum value because such an area may form a weak spot during re-application of forward blocking voltage after turn-off.

In particular, for thyristors having complicated gate region geometry—and thus, in general, a similarly complicated cathode region geometry—as described further above, this is non-trivial. WO 2011/161097 A2 suggests an improved design methodology, which comprises partitioning of the cathode region into a plurality of subregions, in particular covering a neighborhood of the main gate beam or beams and/or one or more bulk regions remote from the main gate beam or beams, respectively; determining prospective short locations to form an—at least substantially—uniform pattern in each subregion; and subsequently forming a global pattern of short locations by adding and/or removing short locations in areas where the subregions overlap or adjoin, such that the above considerations with respect to an optimum distance between individual emitter shorts may be fulfilled as closely as possible when shorts are placed at the locations according to the global pattern. FIG. 5 shows a partial view of a process mask 300 as described in WO 2011/161097 A2, for use during manufacture of a state of the art phase control thyristor. The figure represents a diffusion mask pattern which may be used to define the (n+)-doped emitter regions 106 at the surface of the cathode side 102 of the thyristor 100 when forming the thyristor structure in the semiconductor slab. The white regions indicate areas which may be doped with donors, in particular phosphorous, in order to obtain the (n+)-doped emitter layer 106; whereas the dark regions prevent donor deposition. In particular, emitter shorts 128 will thus be formed at mask short locations 304; and a pilot gate at a pilot gate region 318 in the mask.

While the above methodology allows providing a relatively homogeneous emitter shorts pattern in an exemplary mask region 310 closer to a location of the main gate beams 316, the pattern will be relatively less homogeneous in an exemplary mask region 312 closer to a location of an associated middle line 314 between neighboring main gate beams and in an exemplary region 330 where two or more subregions adjoin. In other words, an optimum global emitter shorts pattern is not achieved. Taking into account that the efficiency of the emitter shorts with respect to quiescence time and dV/dt stability is determined by a weakest point in the shorts pattern, an optimum thyristor performance may thus not be achieved. In addition, tedious manual interaction is generally required in adding and removing short locations.

In addition, the approaches as discussed above generally lead to a relatively nonuniform distribution of emitter shorts near the boundary of the cathode region. In particular, a distance $d_{closest}$ between any given point on the boundary and the location of the emitter short closest to said point may vary significantly depending on where on the boundary the point is located. In particular, the distance $d_{closest}$ may vary between zero and approximately 1.5 $d_{max}$, and/or between zero and approximately 1.5 $d_{avg}$, where $d_{avg}$ is an average distance between the location of a given first emitter short and the location of a second emitter short closest to said first emitter short, over all emitter shorts in the cathode region. As a consequence, a coefficient of variation of the distance $d_{closest}$ over the inner boundary and/or the outer boundary of the cathode region is generally larger than 0.4, possibly larger than 0.7.

As the distribution of emitter shorts in a neighborhood of the inner boundary, and in particular a uniformity of said distribution, is particularly crucial to plasma expansion in the vertical direction, and thus—as explained above—to the dI/dt capability of the thyristor, said capability will be significantly limited by the methods as described above.

From DE 37 44 308 A1 and FR 2 178 390 A other phase control thyristors are known with homogeneously distributed emitter shorts.

U.S. Pat. No. 4,150,390 A shows a thyristor having an emitter shorts distribution separated into two groups close to the gate electrode and farer away from the gate, resulting in a very inhomogeneous distribution of the emitter shorts.

U.S. Pat. No. 4,760,438 A describes a thyristor with emitter shorts disposed in a triangular pattern.

DISCLOSURE OF INVENTION

It is an object of the invention to provide a method for manufacturing a thyristor and a thyristor which overcome the disadvantages as discussed above.

This object is achieved by a method and a thyristor in accordance with the independent patent claims.

A thyristor, in particular a phase control thyristor, in accordance with the present invention comprises:
 a) a semiconductor slab, in particular a semiconductor waver or die, in which a thyristor structure is formed,
 b) a cathode metallization formed on a cathode region on a cathode side surface of the semiconductor slab,
 c) a gate metallization formed on a gate region on the cathode side surface of the semiconductor slab,
 d) a plurality of N discrete emitter shorts, arranged at points $P_i$ in the cathode region, said points having point locations $x_i$, with $i \in \{1; \ldots; N\}$,
 e) the points $P_i$, defining a Delaunay triangulation comprising a plurality of triangles $T_j$ with $j \in \{1; \ldots; M\}$, wherein
 f) for a first subset of triangles $T_l$ with $l \in S_1 \subseteq \{1; \ldots; M\}$,
 g) with each triangle $T_l$ being characterized by a geometric quantity having values $q_{T,l}$ with $l \in S_1 \subseteq \{1; \ldots; M\}$, said geometric quantity having a mean value $\mu$, and i) a coefficient of variation of the values $q_{T,l}$ with $l \in S_1$ is smaller than 0.1, preferably smaller than 0.05, and/or ii) a skewedness of the geometric quantities $q_{T,l}$ with $l \in S_1$ is smaller than 5, preferably smaller than 1, and/or iii) a Kurtosis of the geometric quantities $q_{T,l}$ with $l \in S_1$ is smaller than 20, preferably smaller than 10, and iv) for a second subset of triangles $T_m$ with $m \in S_2 \subset S_1$, for which the respective geometric quantities $q_{T,m}$ with $m \in S_2$ deviate from the mean value by more than a predetermined amount, in particular by more than 30%, (1) a quotient of a standard deviation of the quantities $q_{T,m}$ with $m \in S_2$ and a mean squared value of the geometric quantity $q_{T,l}$ with $l \in S_1$ is less than 1, preferably less than 0.1, and/or (2) a quotient of a number of triangles in the second subset and a number of triangles in the first subset is less than $1.0 \times 10^{-2}$, preferably less than $0.5 \times 10^{-3}$.

A geometric quantity characterizing a triangle $T_l$ may be any quantity indicative of a geometric property of said triangle, in particular:

a) a length $D_l$ of the longest edge of the triangle $T_l$, b) a smallest angle $\alpha_{min,l}$ of the triangle $T_l$, c) a largest angle of the triangle $T_l$, d) a radius $r_{min,l}$ of a circle inscribed of the triangle $T_l$, e) a radius $r_{max,l}$ of a circle circumscribed around each triangle $T_l$, or f) a quality index $q_l$ given by $q_l = r_{min,l}/r_{max,l}$ for each triangle $T_l$.

In a preferred variant, for a thyristor in accordance with the present invention as described above, the first subset $S_1$ comprises all triangles $T_j$ of the Delaunay triangulation with $j \in \{1; \ldots; M\}$, i.e. $S_1 = \{T_1; \ldots; T_M\}$.

In another preferred variant of a thyristor in accordance with the present invention as described above, the first subset comprises only, and preferably all, triangles $T_j$ of the Delaunay triangulation located within a circle C with a diameter $d_C < d_{wafer}$, preferably $d_C < 0.75 \ d_{wafer}$, circumscribing the gate electrode. Most preferably, the first subset comprises only, and preferably all, triangles located within a minimal circle $C_{min}$ i.e. a circle with minimum diameter $d_{C, min}$ circumscribing the gate electrode.

Alternatively, a thyristor, in particular a phase control thyristor, in accordance with the present invention comprises:

h) a semiconductor slab, in particular a semiconductor wafer or die, in which a thyristor structure has been formed, i) a cathode metallization formed on a cathode region on a cathode side surface of the semiconductor slab, j) a gate metallization formed on a gate region on the cathode side surface of the semiconductor slab, k) a plurality of N discrete emitter shorts, arranged at points $P_i$ in the cathode region, said points having point locations $x_i$, with $i \in \{1; \ldots; N\}$, l) the points $P_i$ defining a Delaunay triangulation comprising a plurality of triangles $T_j$ with $j \in \{1; \ldots; M\}$, wherein m) for a first subset of points $P_l$ with $l \in S_1 \subseteq \{1; \ldots; N\}$, n) with each point $P_j$ being characterized by a geometric quantity having values $q_{P,l}$ with $j \in S_1 \subseteq \{1; \ldots; N\}$, said geometric quantity having a mean value $\mu$, and i) a coefficient of variation of the values $q_{P,l}$ with $l \in S_1$ is smaller than 0.1, preferably smaller than 0.05, and/or ii) a skewedness of the geometric quantities $q_{P,l}$ with $l \in S_1$ is smaller than 5, preferably smaller than 1, and/or iii) a Kurtosis of the geometric quantities $q_{P,l}$ with $l \in S_1$ is smaller than 20, preferably smaller than 10, and iv) for a second subset of triangles $T_m$ with $m \in S_2 \subset S_1$, for which the respective geometric quantities $q_{P,m}$ with $m \in S_2$ deviate from the mean value by more than a predetermined amount, (1) a quotient of a standard deviation of the quantities $q_{P,m}$ with $m \in S_2$ and a mean squared values of the geometric quantity $q_{P,l}$ with $l \in S_1 \subseteq \{1; \ldots; N\}$ is less than 1, preferably less than 0.1, and/or (2) a quotient of a number of points in the second subset and a number of triangles in the first subset is less than $1.0 \times 10^{-2}$, preferably less than $0.5 \times 10^{-3}$.

A geometric quantity characterizing a point $P_l$ from a plurality of points $P_i$ with $i \in \{1; \ldots; N\}$ defining a Delaunay triangulation may be any quantity indicative of a geometric property of said point, in particular:

a) a number $N_{edges,l}$ of edges connected to said point $P_l$, b) a number $N_{triangles,l}$ of triangles sharing said point $P_l$, c) a length $l_{min,l}$ of a shortest edge connected to said point $P_l$, d) a length $l_{max,l}$ of a longest edge connected to said point $P_l$, or e) a Volume $V_l$ of Voronoi cell associated with said point $P_l$.

In a preferred variant, for a thyristor in accordance with the present invention as described above, the first subset comprises all points $P_i$ of the Delaunay triangulation with $i \in \{1; \ldots; N\}$, i.e. $S_1 = \{P_1; \ldots; P_N\}$.

In another preferred variant of a thyristor in accordance with the present invention as described above, the first subset comprises only and preferably all, points $P_l$ of the Delaunay triangulation located within a circle C with a diameter $d_C < d_{wafer}$, preferably $d_C < 0.75 \ d_{wafer}$, circumscribing the gate electrode. Most preferably, the first subset comprises only and preferably all, points located within a minimal circle $C_{min}$ i.e. a circle with minimum diameter $d_{C, min}$ circumscribing the gate electrode.

Preferably, in the above examples, N is the exact number of discrete emitter shorts arranged in the cathode region, and/or M the exact number of triangles in the Delaunay triangulation.

A method for manufacturing a thyristor, in particular a phase control thyristor, in accordance with the present invention comprises the steps of a) forming a thyristor structure in a semiconductor slab, in particular a semiconductor wafer or die, b) defining a cathode region on cathode side surface of the semiconductor slab, c) defining a shorts region as a subregion of the cathode region, d) determining, by means of a meshing algorithm, a surface mesh within the shorts region, said surface mesh comprising a plurality of points $P_i$ with $i \in \{1; \ldots; N\}$, e) forming a discrete emitter short at a location of each point $P_i$ with $i \in \{1; \ldots; N\}$, and f) forming a cathode metallization on the cathode region, wherein g) the meshing algorithm is
  i) a Delaunay technique algorithm, in particular a hexagonal Delaunay triangulation algorithm, or is based on
  ii) an advancing front method,
  iii) a circle packing or bubble packing method,
  iv) a paving algorithm, or on
h) a quadtree method, in particular a QUADTREE/OCTREE technique.

Alternatively, a method for manufacturing a thyristor, in particular a phase control thyristor, in accordance with the present invention comprises the steps of
  a) forming a thyristor structure in a semiconductor slab, in particular a semiconductor wafer or die,
  b) defining a cathode region on cathode side surface of the semiconductor slab,
  c) defining a shorts region as a subregion of the cathode region,
  d) determining, by means of a meshing algorithm, a surface mesh (910) within the shorts region, said surface mesh comprising a plurality of cells $C_j$, with each cell delimited by a plurality of edges $e_{jk}$ with $j \in \{1; \ldots ; M\}$ and $k \in \{1; 2; 3; \ldots \}$,
  e) forming a discrete emitter short at one location within each cell $C_j$ or at one location on each edge $e_{jk}$, and
  f) forming a cathode metallization on the cathode region, wherein
  g) the meshing algorithm is
    i) a Delaunay technique algorithm, in particular a hexagonal Delaunay triangulation algorithm, or is based on
    ii) an advancing front method,
    iii) a circle packing or bubble packing method,
    iv) a paving algorithm, or on
  h) a quadtree method, in particular a QUADTREE/OCTREE technique.

In a preferred variant of the method in accordance with the present invention as described above, a discrete emitter short is formed at a centre of each cell $C_j$, in particular at a centre of a circle inscribed or circumscribed to said cell $C_j$, or a centre of gravity of said cell $C_j$; or a centre of said edge $e_{jk}$, wherein $j \in \{1; \ldots ; M\}$ and $k \in \{1; 2; 3; \ldots \}$.

The method according to invention allows manufacturing thyristors with improved global uniformity and homogeneity of the emitter shorts pattern, in an efficient, automized manner, in particular without human interaction in defining an emitter shorts pattern. In addition, significantly improved uniform distribution of emitter shorts near the boundary of the cathode region may be achieved, wherein particularly uniform distributions may be obtained in a neighborhood of the inner boundary, in particular when a meshing algorithm based on advancing front methods is employed. Coefficients of variation of the distance $d_{closest}$ between any given point on the boundary and the location of the emitter short closest to said point over the inner boundary and/or the outer boundary of the cathode region of less than 0.2, preferably less than 0.1, may thus be achieved.

As a consequence, operational characteristics, in particular with respect to forward blocking capability, triggering velocity, quiescence time and transient characteristics such as dV/dt stability may be significantly improved.

Further preferred embodiments of the inventive subject matter are disclosed in the dependent claims, and/or will be apparent from and elucidated with reference to the embodiments described further below in combination with the drawings as listed hereinafter.

In as far as technically possible, also combinations of embodiments of the invention described in the above and in the following may be embodiments of the method and the system, even if not mentioned explicitly.

BRIEF DESCRIPTION OF DRAWINGS

The subject matter of the invention will be explained in more detail in the following text with reference to the attached drawings, in which:

FIG. 1 shows a cross-sectional view of doping regions and contact arrangements of a state-of-the-art phase controlled thyristor.

FIG. 2 shows a cross-sectional view of a state-of-the-art phase controlled thyristor with an amplifying gate structure.

FIG. 3 shows a cross-sectional view of a portion of a state-of-the-art phase controlled thyristor with emitter shorts.

FIG. 4 shows a top view onto an emitter shorts pattern of the phase controlled thyristor of FIG. 3.

The reference signs used in the figures and their meaning are summarized in the list of reference signs. Generally, alike or alike-functioning parts are given the same reference signs. The described embodiments are meant as examples and shall not confine the invention.

MODES FOR CARRYING OUT THE INVENTION

Figure 6:
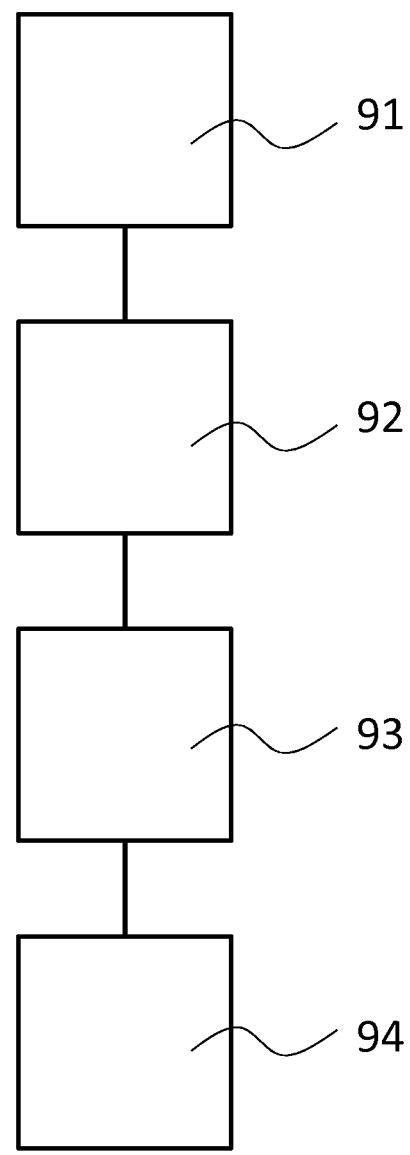
FIG. 6 shows a schematic representation of an exemplary variant of the method for manufacturing a thyristor in accordance with the present invention

FIG. 6 shows a schematic representation of an exemplary variant of the method for manufacturing a thyristor in accordance with the invention. In a first method step 91, a cathode region is defined on cathode side surface on a first main side of a semiconductor slab, in which a thyristor structure, as e.g. shown in FIG. 1 and FIG. 2 has been formed. In a subsequent method step 92, a shorts region is selected, which may be a subregion of the cathode region, or may be identical to the cathode region. In a further subsequent method step 93, a surface mesh is determined within the shorts region by a meshing algorithm, wherein said surface mesh comprises a plurality of points $P_i$ with $i \in \{1; \ldots ; N\}$ and a plurality of cells $C_j$, preferably triangles $T_j$, with $j \in \{1; \ldots ; M\}$, i.e. with a total of N points and M cells, wherein, in general M≈N and N>500, preferably N>1000. An advancing front method as e.g. described in "*NETGEN—An advancing front 2D/3D-mesh generator based on abstract rules*", Computing and Visual Science 1, 41-53 (1997), Springer-Verlag 1997, which is hereby included by reference in its entirety; a Delaunay technique or advanced Delaunay technique; or a Quadtree/Octree technique is used as meshing algorithm. In a further subsequent method step 94, a discrete emitter short is formed on the first main side of the semiconductor slab at a location of each point $P_i$ with $i \in \{1; \ldots ; N\}$. Finally, a cathode metallization is provided over the cathode region in a further subsequent method step 94.

Preferably, when using an advancing front method for determining the surface mesh, meshing is started from a boundary or border of the shorts region, wherein the boundary is described by curved lines, preferably by Bezier curves or NURBS, and preferably discretized according to a desired distance $d_{max}$ between the shorts. Then a first layer of mesh cells, preferably triangles, most preferably equilateral triangles, is created. Subsequently, additional layers of mesh cells are created, thus forming an advancing front of mesh elements. When the advancing fronts collide and the whole shorts region has been filled with mesh elements, meshing is stopped. Preferably, the triangles are re-arranged by means of a so called smoothing technique, in particular Laplacian smoothing, Poisson smoothing, mesh jiggling, and/or trapezium smoothing to improve geometrical properties of the mesh, in particular to increase homogeneity and uniformity. Preferably, the smoothing techniques employ edge swapping, edge splitting, edge collapsing and or node smoothing.

Preferably, when using a Delaunay technique algorithm for determining the surface mesh, an iterative technique is used, as e.g. based on a so called "divide and conquer" technique, as e.g. described in the article "Constrained delaunay triangulations" by Chew, L. Paul, in Algorithmica 4, no. 1-4 (1989), pp. 97-108. Alternatively, a Voronoi triangulation may be constructed in a first step, and a Delaunay triangulation subsequently determined from a dual triangulation, as e.g. described in the article "Primitives for the manipulation of general subdivisions and the computation of Voronoi" by Leonidas Guibas and Jorge Stolfi in ACM Trans. Graph. 4, 2 (April 1985), pp. 74-123.

QUADTREE/OCTREE techniques which are based on dividing a region into rectangular cells of different sizes, and subsequently dividing the rectangular cells into triangles, may also be used advantageously in obtaining the surface mesh.

For both Delaunay/Voronoi and QUADTREE/OCTREE techniques, smoothing techniques as described above may be employed to further refine the triangles obtained.

Alternatively, the surface mesh may advantageously also be determined based on one of the following methods:

the so called bubble packing method as described by Kim, Jeong-Hun, et al. "Adaptive mesh generation by bubble packing method." Structural Engineering and Mechanics 15.1 (2003): 135-150, see, in particular, FIG. 6.

quadtree methods in which quadrangles are generated and subsequently cut into triangles, as described e.g. in Samet, Hanan. "The quadtree and related hierarchical data structures." ACM Computing Surveys (CSUR) 16.2 (1984): 187-260.

so called paving algorithms as described, e.g., in Randy R. Lober, Timothy J. Tautges, Courtenay T. Vaughan, Sandia Report: SAND97-0545 • UC-705 Unlimited Release Printed March 1997, "Parallel Paving: An Algorithm for Generating Distributed, Adaptive, All-quadrilateral Meshes on Parallel Computers"; see, in particular, FIG. 7.

circle packing, as described, e.g., in: Bern, Marshall, and David Eppstein. "Quadrilateral meshing by circle packing", International Journal of Computational Geometry & Applications 10.04 (2000): 347-360.

Hexagonal Delaunay Triangulation, as described, e.g., in Sußner, Gerd and Greiner, Günther, "Hexagonal Delaunay Triangulation", Proceedings of the 18th International Meshing Roundtable, 2009, pp. 519-538.

All references cited above are hereby included by reference in their entirety.

Preferably, a meshing algorithm producing an unstructured mesh is employed. An unstructured mesh is characterized by irregular connectivity, whereas a structured mesh is characterized by regular connectivity that can be expressed as a two or three dimensional array (like a checkerboard or hive cells). A meshing algorithm producing hybrid mesh may employed with advantage. A hybrid mesh is a mesh that contains structured portions and unstructured portions, as, e.g., detailed in Finite Element Mesh Generation, by D. S. H. Lo, Taylor & Francis, ISBN 9780415690485.

In a preferred variant of the of the method for manufacturing a thyristor in accordance with the invention, a process mask is formed prior to step 94, and used in step 94 to selectively dope a region of the semiconductor slab adjoining the cathode side surface so that discrete emitter short are formed at locations corresponding to points $P_i$ with $i \in \{1; \ldots ; N\}$.

Figure 7A:
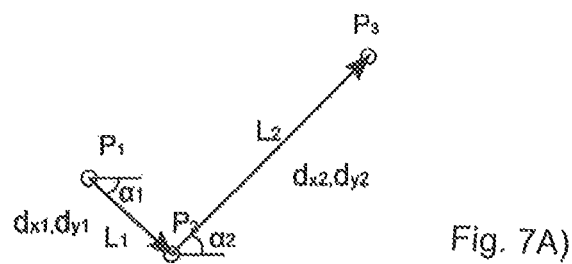
FIG. 7A illustrates vector operations for extending a shape of a gate region during mesh generation.
Figure 7B:
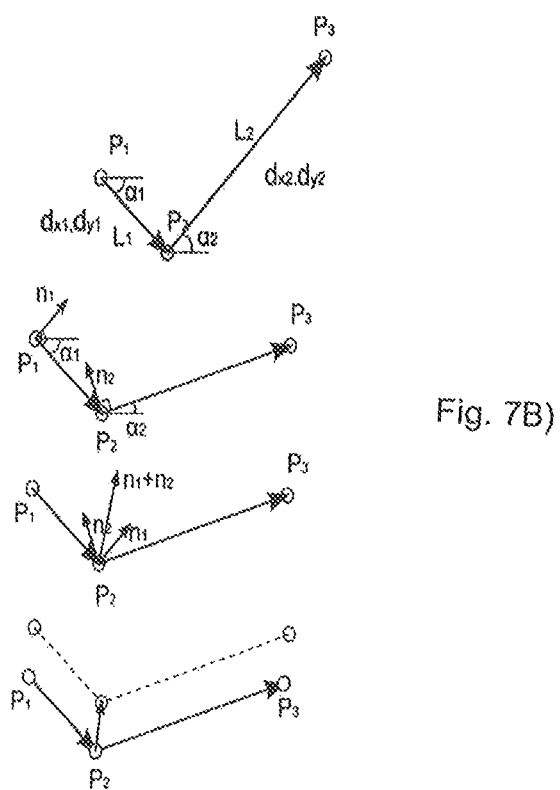
FIG. 7B illustrates a subsequent step in vector operations for extending shape of the gate region during mesh generation.

In another exemplary variant of the method for manufacturing a thyristor in accordance with the invention, the mesh is obtained by means of a Delaunay technique algorithm based on an advancing front method as will be described in what follows:

In a first step, a shape of the gate region is represented by a closed set of vectors, each vector defined by its angle and length, as shown in FIG. 7A. A closed polygon representing the geometry is thus obtained. In a subsequent step, said geometry is extended by calculating a weighted normal at each vertex, i.e. at each corner of the polygon. Checks are made to ensure that a new shape thus obtained strictly contains the previous shape and that no sharp angles are artificially introduced. This is shown in FIG. 7B. Preferably, this step is repeated multiple times.

Figure 5:
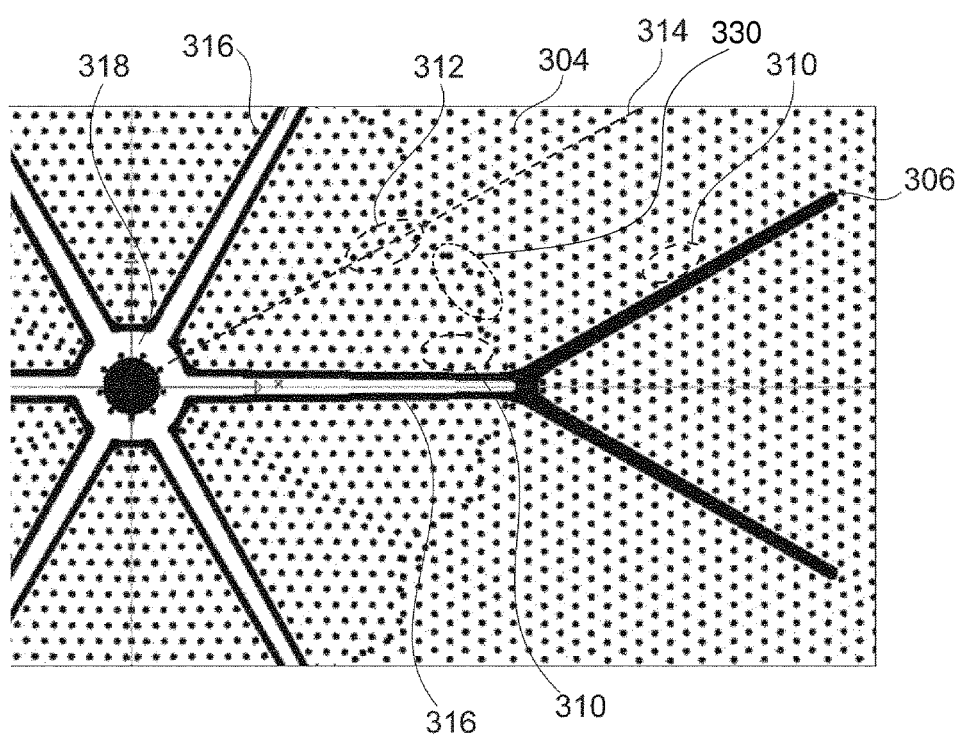
FIG. 5 shows a partial view of a process mask as described in the state of the art
Figure 8A:
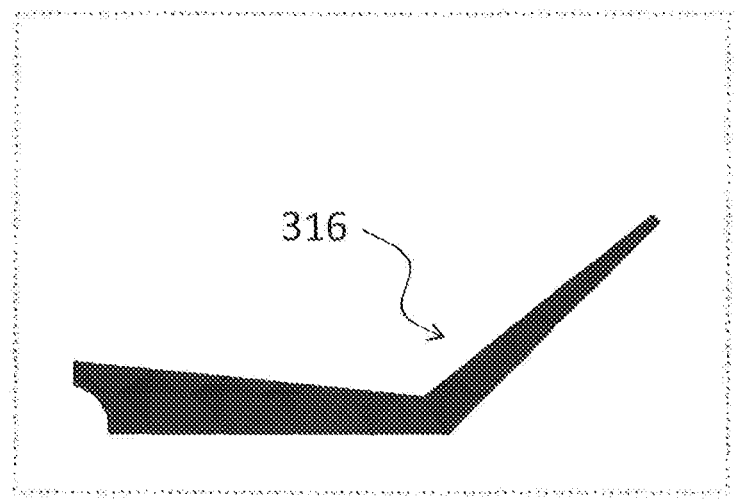
FIG. 8A illustrates a variant for obtaining a surface mesh for use with the method in accordance with the present invention.
Figure 8B:
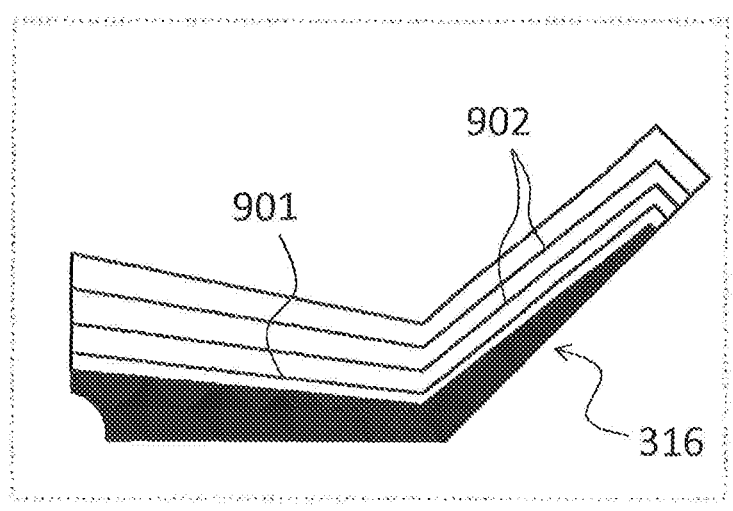
FIG. 8B illustrates another depiction of the FIG. 8A illustration.
Figure 8C:
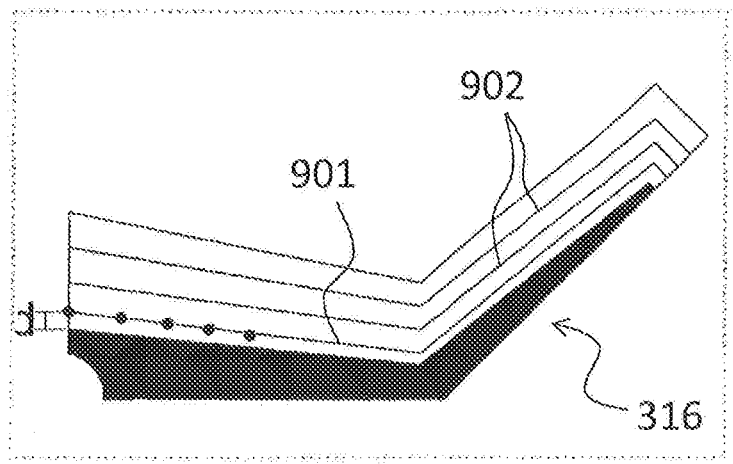
FIG. 8C illustrates further depictions of the FIG. 8A illustration.

The result of these steps is shown in FIGS. 8A and 8B for the main gate geometry from FIG. 5. Given a generic geometry of the gate region, the previous steps allow to roughly predict a direction of plasma spread. A first distance $d = d_{adv,1}$ by which the shape of the gate region is extended in a direction of the weighted normal is preferably set according, in particular equal, to a lithographic resolution limit, in order to maximize dV/dt capability. Subsequent distances $d_{adv}$, for extending the shape are set according to the desired short spacing $d_{max}$. On a first extended shape 901 obtained according to the above steps, short locations are preferably provided with distances at least approximately equaling the desired short spacing $d_{max}$ as shown in FIG. 8C), thus representing a first row of short locations adjacent to the gate region.

Figure 8D:
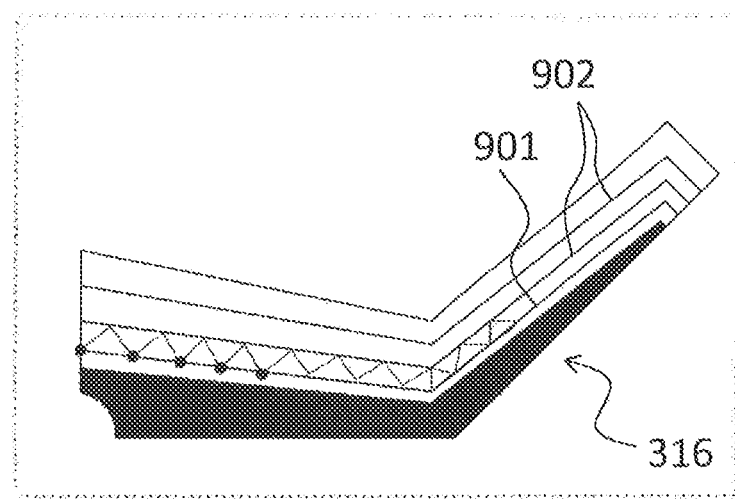
FIG. 8D-8F illustrate subsequent rows for the variant illustrated in FIG. 8C.
Figure 8E:
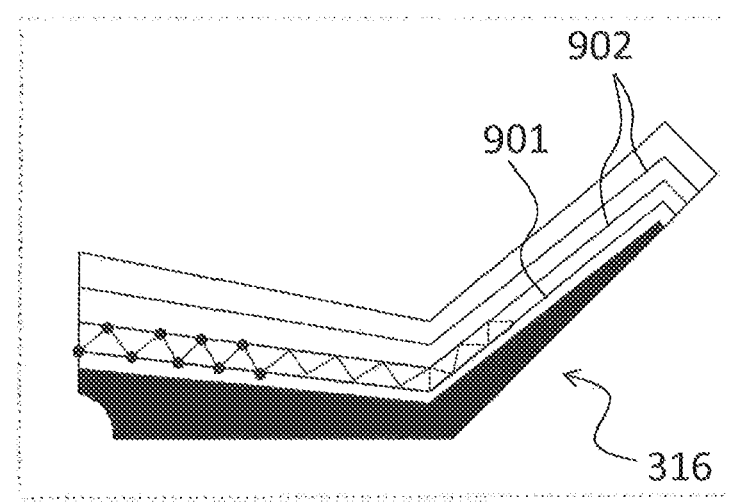
Figure 8F:
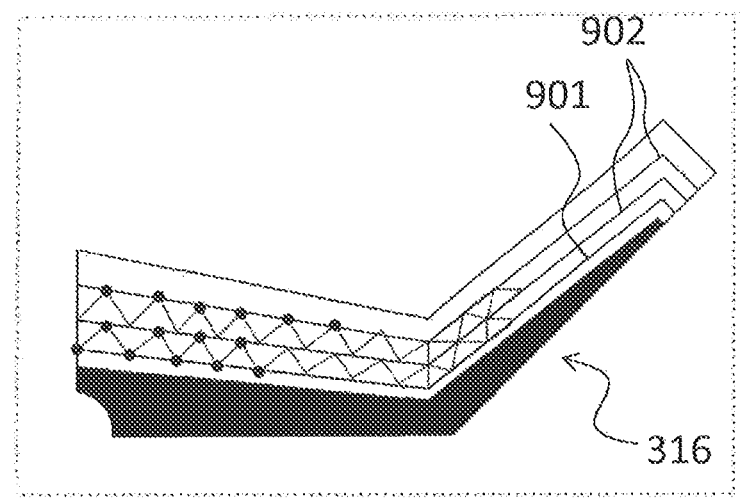

Subsequent rows are then obtained by building a Delaunay triangulation using the subsequently obtained extended shapes 902 from the above steps, as indicated in FIG. 8D)-F). A uniformity of the resulting short locations pattern can be controlled by parameters of the Delaunay triangulation. Preferably, all angles should be close to 60 degrees, i.e. within a specified tolerance. Likewise, all maximum edge lengths should be close to the desired short spacing $d_{max}$, i.e. again within a specified, second tolerance.

The variant as described above leads to very uniform spacing of the short locations throughout the thyristor, wherein the shorts are also aligned in the direction of the plasma spread, to reduce the impact of the shorts on plasma propagation speed. As an optional step the short locations can preferably be further optimized using typical algorithms for Delaunay triangulation. For example, even higher short location uniformity can be obtained through techniques such as Laplacian smoothing, entropy-optimal point-location, Delaunay edge flipping.

Preferably, if any symmetries are present in the geometry of the gate region, these symmetries are also taken into account when obtaining the mesh by applying the methods according to any of the variants as described above only to a portion, preferably a portion without further symmetries, of the structure, thus obtaining a partial mesh, and by subsequently obtaining a complete mesh by symmetric mapping of the partial mesh.

Mesh quality indicative of uniformity and homogeneity of the short locations may be measured based on a variety of quantities.

The surface mesh obtained in accordance with any of the variants as described above comprises several pluralities of geometric objects, in particular a plurality of points $P_i$ with $i \in \{1; \ldots; N\}$ defining a Delaunay triangulation, as described, e.g., in https://en.wikipedia.org/w/index.php?title=Delaunay_triangulation&oldid=662807396 and https://en.wikipedia.org/w/index.php?title=Delaunay_triangulation&oldid=614036873 which are hereby included by reference in their entirety.

In particular, the surface mesh obtained in accordance with any of the variants as described above comprises several pluralities of geometric objects, in particular a plurality of points $P_i$ with $i \in \{1; \ldots; N\}$ defining a restricted Delaunay triangulation on the cathode region. Restricted Delaunay triangulations are discussed in the article by Jean-Philippe Pons, Jean-Daniel Boissonnat, "*Delaunay Deformable Models: Topology-Adaptive Meshes Based on the Restricted Delaunay Triangulation*", CVPR, 2007, 2013 IEEE Conference on Computer Vision and Pattern Recognition, pp. 1-8, doi:10.1109/CVPR.2007.383019, Print ISBN: 1-4244-1179-3.

Said Delaunay triangulation in turn comprises a plurality of triangles $T_j$ with $j \in \{1; \ldots; M\}$, each comprising three edges $e_{jk}$ with $k \in \{1; 2; 3\}$. For each of the geometric objects, one or more geometric quantities may be defined. In particular, each triangle $T_j$ has an area $A_j$. For $j \in \{1; \ldots; M\}$, a radius $r_{ic,j}$ of a circle inscribed to triangle $T_j$ may be determined according to $r_{ic,j} = A_j/(2\Pi_{k=1}^3 l_{jk})$, whereas a radius $r_{cc,j}$ of a circumscribed circle is given by $r_{cc,j} = \Pi_{k=1}^3 l_{jk}/(4A_j)$. Further, for each triangle $T_j$ with $j \in \{1; \ldots; M\}$ a diameter $D_j$ may be defined by the length of the longest edge $e_{jk}$ with $k \in \{1; 2; 3\}$ in said triangle $T_j$ according to $D_j = \max_k \{l_{jk}\}$. and having lengths $l_{jk}$ with $k \in \{1; 2; 3\}$. Each edge $e_{jk}$ has a length $l_{jk}$; and an angle $\alpha_{jk}$ with $k \in \{1; 2; 3\}$ opposite each edge $\alpha_{jk}$ may be calculated using Heron's formula.

Several metrics may be defined which may be used in measuring mesh quality. Preferably, these metrics are calculated based on one geometric quantity of either each triangle, each point or each edge. In particular, statistical measures such as standard deviation, skewedness, kurtosis may be used in determining the metric.

For a set of N values $x_i$ with $i \in \{1; \ldots; N\}$, a mean value $\mu$, also referred to as mean, is defined according to $$\mu = \frac{1}{N} \sum_{i=1}^{N} x_i.$$

A standard deviation $\sigma$ is defined according to $$\sigma = \sqrt{\frac{1}{N} \sum_{i=1}^{N} (x_i - \mu)^2}, \text{ where } \mu = \frac{1}{N} \sum_{i=1}^{N} x_i.$$

As a rough guidance, for an acceptable mesh, a coefficient of variation $\sigma/\mu$ should be less than 0.1, preferably less than 0.05, for at least one, preferably all geometric quantities as described above.

A skewedness $\gamma_1$ is defined according to:

$$\gamma_1 = \sum_{i=1}^{N} \left(\frac{x_i - \mu}{\sigma}\right)^3$$

As a rough guidance, for an acceptable mesh, skewedness should be less than 5, preferably less than 1.5, and most preferably as close to 0 as possible, for at least one, preferably all geometric quantities as described above.

A kurtosis $\beta_2$ is defined according to:

$$\beta_2 = \sum_{i=1}^{N} (x_i - \mu)^4 \bigg/ \left(\sum_{i=1}^{N} (x_i - \mu)^2\right)^2$$

As a rough guidance, for an acceptable mesh, kurtosis should be less 20.0 and ideally less than 10.0, for at least one, preferably all geometric quantities as described above.

So called outliers, in particular a number of extreme outliers, may also be used as a basis for statistical measures. Outliers may be defined in many different ways. One preferred way is to define an outlier as a value that deviates from the mean value p by more than a predetermined amount, e.g. by more than 30% of the mean itself.

Exemplary metrics based on a set of outliers are:
A standard deviation of the outliers' values/squared mean of all the values contributing to the mean value. Should be as close to 0 as possible. Less than 1 is a good value
An amount of outliers, defined as the ratio of a number of outliers and a total number of values. As a rough guidance, for an acceptable mesh, the amount of outliers should be less than $10^{-2}$, preferably less than $5.0 \cdot 10^{-3}$ for at least one, preferably all geometric quantities as described above.

The following exemplary metrics have proven particularly efficient in characterizing mesh quality:
1. Standard deviation, skewedness and kurtosis, and amount of extreme outliers of the diameters $D_j$ of all triangles Tj with $j \in \{1; \ldots ; M\}$.
2. Standard deviation, skewedness, kurtosis and amount of extreme outliers of the lengths $l_{jk}$ of all edges in the mesh, i.e. with $jk \in \{1; \ldots ; M\} \times \{1; 2; 3\}$.
3. Mean, standard deviation, skewedness, kurtosis and amount of extreme outliers of the angles $\alpha_{jk}$ of all triangles in the mesh, i.e. with $jk \in \{1; \ldots ; M\} \times \{1; 2; 3\}$. Preferably, the mean value equals at least approximately 60°.
4. Standard deviation, skewedness, kurtosis and amount of extreme outliers of $\Gamma := 2*r_{ic,j}/r_{cc,j}$. Preferably, the value equals at least approximately 1.0 for all triangles Tj with $j \in \{1; \ldots ; M\}$. As a rough guidance, for an acceptable mesh, $\Gamma$ should be less than 0.8 for at most 10% of all triangles Tj, preferably less than 0.85 for at most 5% of all triangles Tj
5. Standard deviation, skewedness, kurtosis and amount of extreme outliers of $E := A_j^{2/3}/(\Sigma_{k=1}^3 l_{jk})^2$. As a rough guidance, for an acceptable mesh, $\Gamma$ should be less than 0.8 for at most 10% of all triangles Tj; preferably less than 0.85 for at most 5% of all triangles Tj
6. Standard deviation, skewedness, kurtosis and amount of extreme outliers of $\rho := \min_k\{l_{jk}\}/\max_k\{l_{jk}\}$. As a rough guidance, for an acceptable mesh, $\Gamma$ should be less than 0.8 for at most 10% of all triangles Tj; preferably less than 0.85 for at most 5% of all triangles Tj.
7. Standard deviation, skewedness, kurtosis and amount of extreme outliers of a ratio of a maximum length of all edges connected to a point $P_i$ with $i \in \{1; \ldots ; N\}$ and a mean value of the length of all edges connected to said point. An optimum value is 1.0.
8. Standard deviation, skewedness, kurtosis and amount of extreme outliers of a number $N_{edges,i}$ of edges connected to a point $P_i$ with $i \in \{1; \ldots ; N\}$. An optimum value is $N_{edges,i} = 6$.
9. Standard deviation, skewedness, kurtosis and amount of extreme outliers of a mean value of all angles associated with a point $P_i$ with $i \in \{1; \ldots ; N\}$. Preferably, the mean value equals at least approximately 60°
10. Standard deviation, skewedness, kurtosis and amount of extreme outliers of volume of a Voronoi cell associated with a point $P_i$ with $i \in \{1; \ldots ; N\}$.
11. Standard deviation, skewedness, kurtosis and amount of extreme outliers of a number $N_{triangles,i}$ of triangles that share a point $P_i$ with $i \in \{1; \ldots ; N\}$. An optimum value is $N_{triangles,i} = 6$.

A so called turn function difference may be used to assess a uniformity of the distribution of emitter shorts near the boundary of the cathode region. To determine the turn function difference, an outer envelope of the emitter shorts distribution is defined as the smallest contour, i.e. the shortest polygonal, simple closed curve, which encloses all emitter short locations in the cathode region. Similarly, an outer envelope is defined as the largest contour, i.e. the longest polygonal, simple closed curve that encloses the gate region, but encloses none of the emitter short locations in the cathode region.

Figure 9:
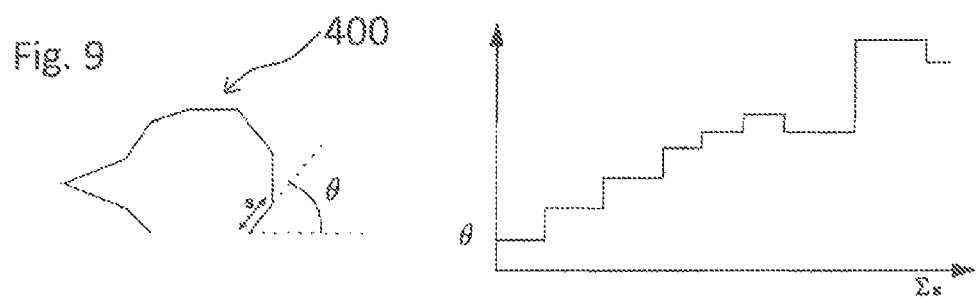
FIG. 9 illustrates a turn function for an exemplary polygon.

As described, e.g., in the articles by Arkin, Esther M., et al., "*An efficiently computable metric for comparing polygonal shapes*", IEEE Transactions on Pattern Analysis & Machine Intelligence 3 (1991): 209-216, and by Latecki, Longin Jan, and Rolf Lakämper, "*Shape similarity measure based on correspondence of visual parts*", Pattern Analysis and Machine Intelligence, IEEE Transactions on 22.10 (2000): 1185-1190, which are hereby included by reference in their entirety, so called turn function $\Theta(s)$ may be defined for a polygon, wherein $\Theta(s)$ is the angle between two points of the polygon, while s is the total distance along a perimeter of the polygon. Based on this definition, is it possible to evaluate a turn functions, in particular turn functions $\Theta_{cathode,inner}(s)$ and $\Theta_{cathode,outer}(s)$ for the cathode region boundary, a turn function $\Theta_{gate}(s)$ for the outer gate region boundary, and turn functions $\Theta_{env,inner}(s)$ and $\Theta_{env,outer}(s)$ for the inner and outer envelope, respectively, of the emitter shorts distribution. A turn function $\Theta(s)$ for an exemplary polygon 400 is illustrated in FIG. 9.

Various turn function differences may then be used as an indication of how similar—or different—shapes of various geometric objects as introduced above are. In particular, a turn function difference TFD1 between the outer boundary of the cathode region and the outer envelope of the emitter shorts distribution is given by $$TFD1 = \frac{\int |\Theta_{cathode,outer} - \Theta_{enc,outer}| ds}{2\pi \int_{cathode,outer} ds}$$

and gives an indication of how similar the outer boundary of the cathode region and the outer envelope of the emitter shorts distribution are, whereas a turn function difference TFD2 between an inner envelope of the emitter shorts distribution and the outer boundary of the gate region is given by $$TFD2 = \frac{\int |\Theta_{gate} - \Theta_{enc,inner}| ds}{2\pi \int_{gate} ds}$$

and gives an indication of how similar the inner envelope of the emitter shorts distribution and the outer boundary of the gate region are. Turn function differences typically have values between 0 and 1.

For thyristors manufactured in accordance with the inventive methods as described herein, values smaller than 0.15, in particular smaller than 0.1, albeit preferably larger than $10^{-4}$ may be achieved for the turn function differences, in particular for TFD1 and/or TFD2, as defined above.

Figure 10:
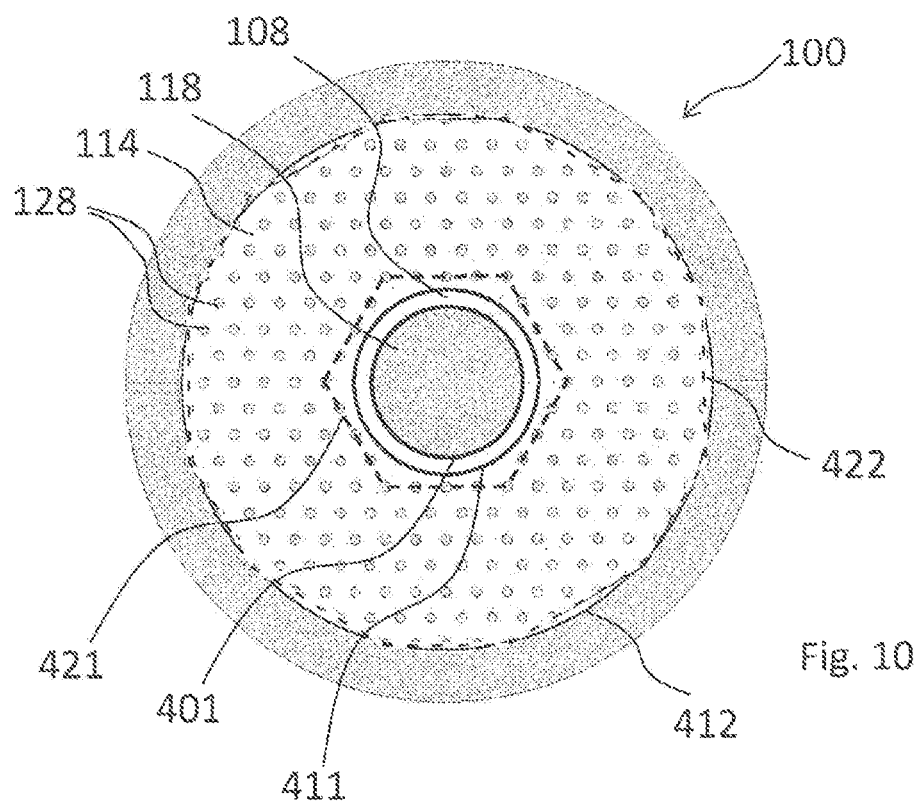
FIG. 10 shows a top view of a phase controlled thyristor 100 with emitter shorts 128 at locations obtained in accordance with prior art.

FIG. 10 shows a top view of the cathode side surface of a phase controlled thyristor 100 with emitter shorts 128 at locations obtained in accordance with prior art. Gate region boundary 401, inner boundary of the cathode region 411, outer boundary of the cathode region 412, inner envelope 421 and outer envelope 422 of the emitter shorts distribution are illustrated exemplary.

Figure 11A:
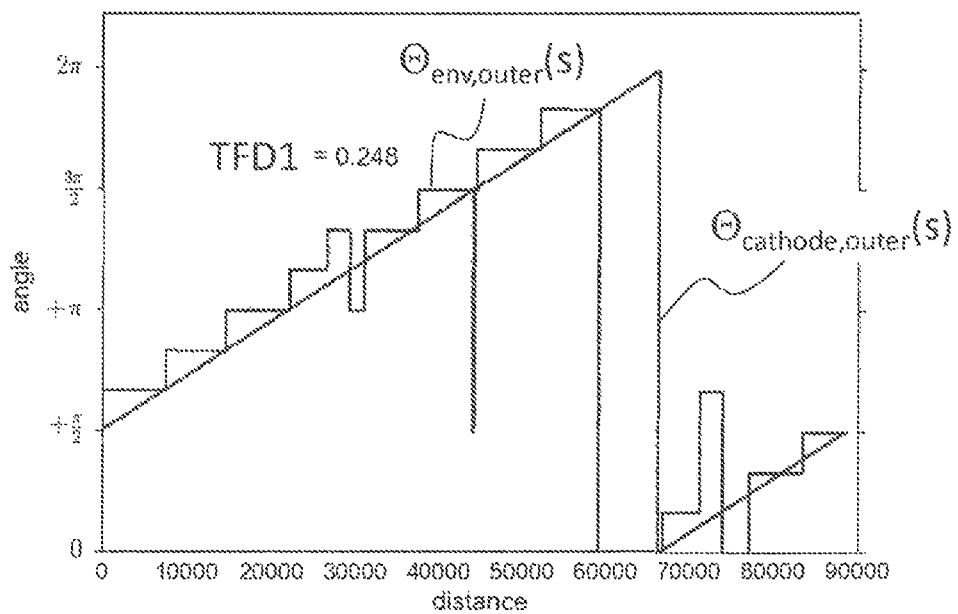
FIG. 11A illustrates turn functions for the thyristor from FIG. 10.
Figure 11B:
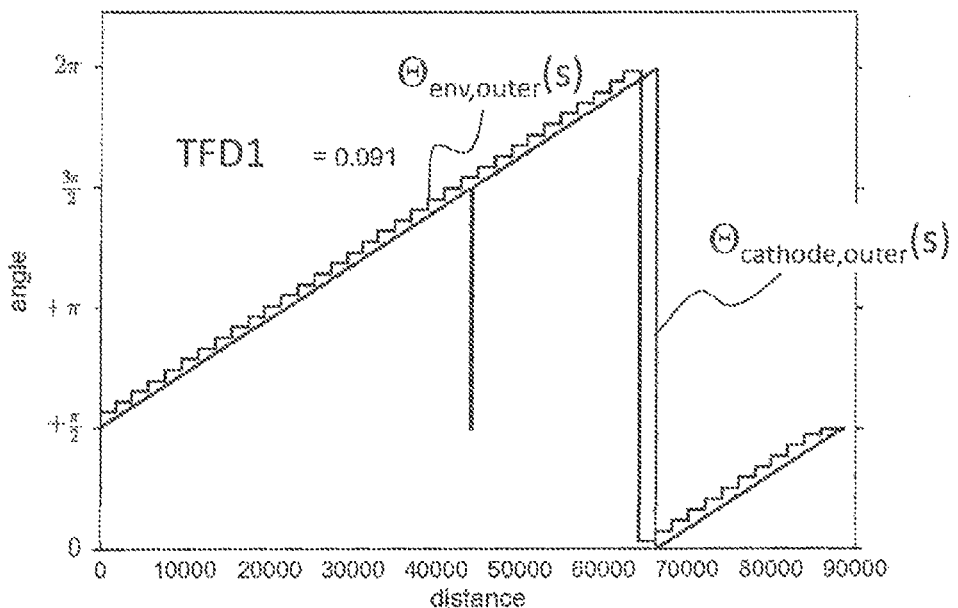
FIG. 11B illustrates turn functions for a thyristor in accordance with the present invention.

FIG. 11A illustrates the turn functions $\Theta_{cathode,outer}(s)$ and $\Theta_{env,outer}(s)$ for the phase controlled thyristor 100 from FIG. 10. A turn function difference of TFD1=0.248 was found for this example. FIG. 11B illustrates the turn functions $\Theta_{cathode,outer}(s)$ and $\Theta_{env,outer}(s)$ for a phase controlled thyristor similar to the one from FIG. 10, albeit with emitter shorts 128 at locations obtained in accordance with the present invention. A turn function difference of TFD1=0.091 was found for this example.

Figure 12:
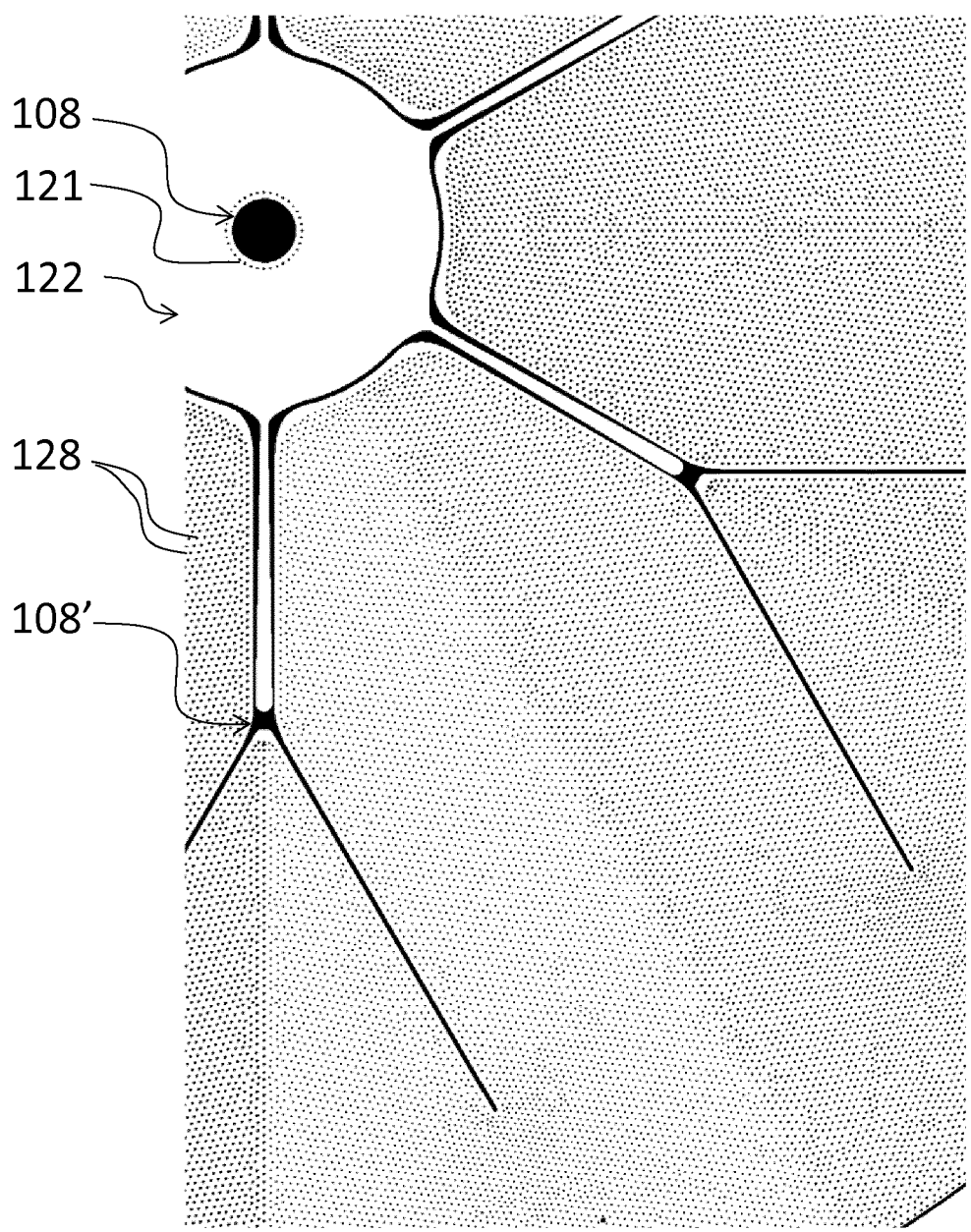
FIG. 12 shows a partial top view of the cathode side surface of a thyristor in accordance with the present invention.

FIG. 12 shows a partial top view of the cathode side surface of a thyristor in accordance with the present invention, which may be manufactured according to one of the method variants as described above. A plurality of additional shorts 121 may be present in the further (n+)-doped emitter layer 122, mainly for controlling a non-trigger current. These are not to be regarded as emitter shorts, and do not form part of the Delaunay triangulation defined by points $P_i$ with $i \in \{1; \ldots; N\}$ in the cathode region at which the emitter shorts 128 are located.

Figure 13:
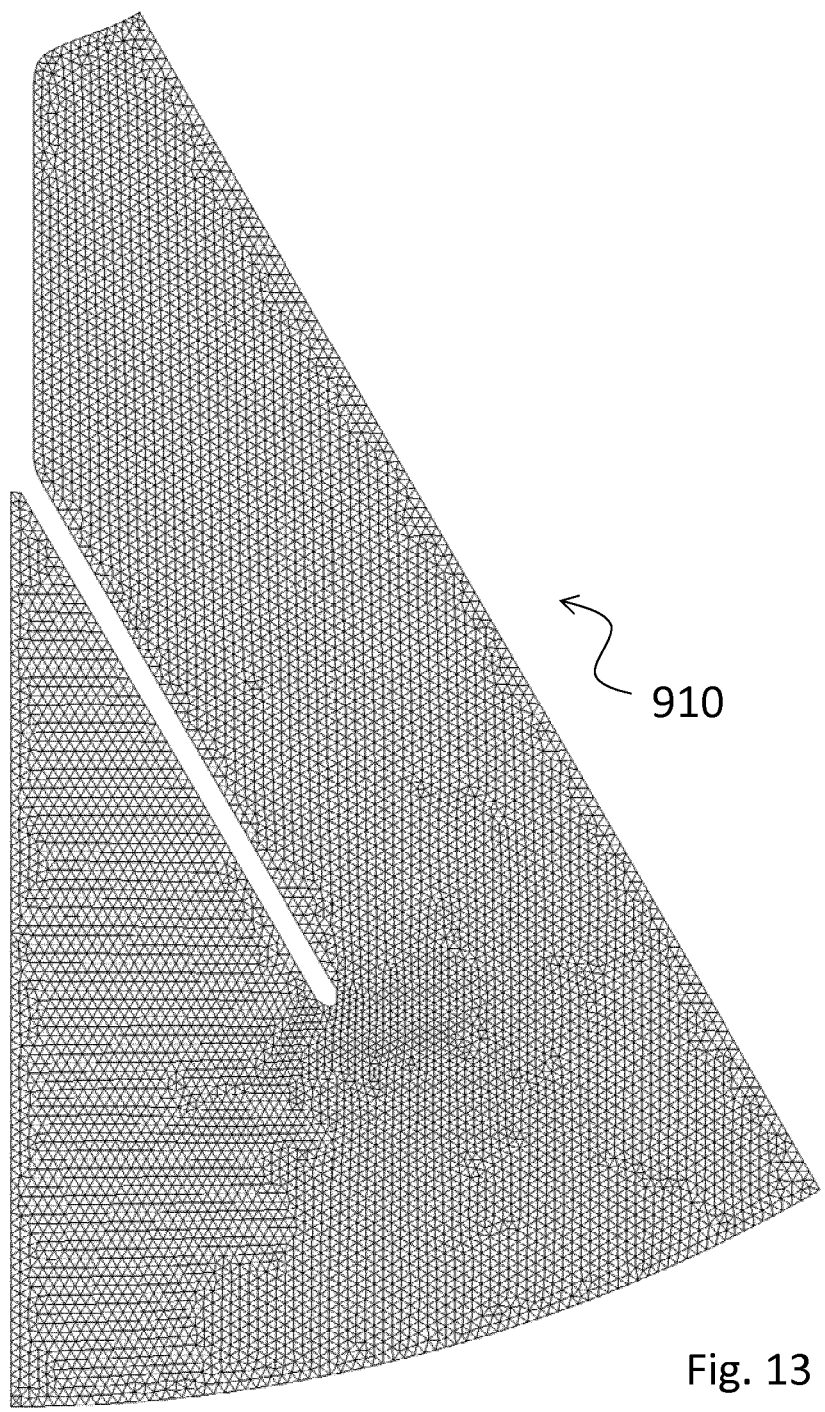
FIG. 13 shows a portion of a surface mesh as obtained in a variant of the method in accordance with the present invention.

FIG. 13 shows a portion of a surface mesh 910 for use in manufacturing a thyristor as shown in FIG. 9.

Exemplary diameters of the emitter shorts 128, i.e. the largest extension on the cathode side surface 102, may be between 30 µm up to 500 µm, preferably between 50 µm to 400 µm, and most preferably between 100 µm to 300 µm. A total surface area of the emitter shorts 128 is 2.5% to 20% of a surface are of the cathode region. That means that between 12 emitter shorts 128 per cm$^2$ and 30000 dots per cm$^2$ are provided on the cathode side surface 102. Exemplarily, if the emitter shorts 128 are small, more emitter shorts 128 will be present than if the emitter shorts 128 have a large diameter.

Preferably, in embodiments as described above and below, the conductivity types may be interchanged, i.e. all (n−)-, n-, or (n+)-layers and regions as described may be replaced by (p−)-, p-, or (p+)-layers and regions, respectively, and vice versa.

Unless stated otherwise, all doping concentrations N referred to in this patent application are net doping concentrations, where N is defined as $N := N_D - N_A$ for regions or layers in which a total density of donors $N_D$ is larger than a total density of acceptors $N_A$, i.e. $N_D > N_A$, i.e. in particular for n-doped regions or layers; and as $N := N_A - N_D$ for regions or layers in which a total density of donors $N_D$ is smaller than a total density of acceptors $N_A$, i.e. in particular for p-doped regions or layers. Preferably, in embodiments as described above, suffixes "−" and "+" after doping type indicators p, n are used to express relative net doping concentrations. In particular, a net doping concentration N(n+) of each (n+)-doped region or layer is larger than a net doping concentration N(n) of each (n)-doped region or layer, which in turn is larger is larger than a net doping concentration N(n−) of each (n−)-doped region or layer. Likewise, a net doping concentration N(p+) of each (p+)-doped region or layer is larger than a net doping concentration N(p) of each (p)-doped region or layer, which in turn is larger than a net doping concentration N(p−) of each (p−)-doped region or layer. Preferably. N(n+)≥N(p), N(n)≥N(p−), N(p+)≥N(n) and/or N(p)≥N(n−); most preferably, N(n+)>N(p), N(n)>N (p−), N(p+)>N(n) and/or N(p)>N(n−) also hold. On the other hand, where identical suffixes are used with regard to different layers or regions, this shall preferably not be construed to imply that the doping concentrations of said different layers or regions are identical.

Preferably, in embodiments as described above and below, where a doping concentration or net doping concentration of a region or layer is referred to, this is preferably to be understood as a maximum net doping concentration within said region or layer. In particular for doped regions or layers which were formed including a dopant diffusion process step, a local net doping concentration decays in one or more spatial directions from an area within the region or layer, in which area the local doping concentration equals the maximum net doping concentration.

Unless stated otherwise, it is assumed that throughout this patent application, a statement a≈b implies that |a−b|/(|a|+ |b|)<10$^{-1}$, preferably |a−b|/(|a|+|b|)<10$^{-2}$, wherein a and b may represent arbitrary variables as described and/or defined anywhere in this patent application, or as otherwise known to a person skilled in the art. Further, a statement that a is at least approximately equal or at least approximately identical to b implies that a≈b, preferably a=b. Further, unless stated otherwise, it is assumed that throughout this patent application, a statement a>>b implies that a>10b, preferably a>100b; and statement a<<b implies that 10a<b, preferably 100a<b.

It should be noted that the term "comprising" does not exclude other features, in particular elements or steps, and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

Preferred embodiments of the present invention, in particular as described above, may be realized as detailed in the items listed below, advantageously in combination with one or more of the features as detailed above.

1) A thyristor, in particular a phase control thyristor, comprising:
   a) a semiconductor slab, in particular a semiconductor waver or die, in which a thyristor (100, 100') structure is formed,
   b) a cathode metallization (114) formed on a cathode region on a cathode side (102) surface of the semiconductor slab,
   c) a gate metallization (118) formed on a gate region on the cathode side surface of the semiconductor slab,
   d) a plurality of N discrete emitter shorts (128), arranged at points $P_i$ in the cathic qu
   e) the points $P_i$ defining a Delaunay triangulation comprising a plurality of triangles $T_j$ with $j \in \{1; \ldots; M\}$,
   characterized in that
   f) for a first subset of triangles $T_l$ with $l \in S_1 \subseteq \{1; \ldots; M\}$,
   g) with each triangle $T_l$ being characterized by a geometric quantity having values $q_{T,l}$ with $l \in S_1 \subseteq \{1; \ldots; M\}$, said geometric quantity having a mean value µ, and
      i) a coefficient of variation of the values $q_{T,l}$ with $l \in S_1$ is smaller than 0.1, preferably smaller than 0.05, and/or
      ii) a skewedness of the geometric quantities $q_{T,l}$ with $l \in S_1$ is smaller than 5, preferably smaller than 1, and/or
      iii) a Kurtosis of the geometric quantities $q_{T,l}$ with $l \in S_1$ is smaller than 20, preferably smaller than 10, and/or
      iv) for a second subset of triangles $T_m$ with $m \in S_2 \subset S_1$, for which the respective geometric quantities $q_{T,m}$ with $m \in S_2$ deviate from the mean value by more than a predetermined amount, in particular by more than 30%.
         (1) a quotient of a standard deviation of the quantities $q_{T,m}$ with $m \in S_2$ and a mean squared value of the geometric quantity $q_{T,l}$ with $l \in S_1$ is less than 1, preferably less than 0.1, and/or (2) a quotient of a number of triangles in the second subset and a number of triangles in the first subset is less than $1.0 \times 10^{-2}$, preferably less than $0.5 \times 10^{-3}$.

2) A thyristor according to item 1, characterized in that for all triangles in the first subset, the geometric quantity $q_{T,l}$ is defined as either
   a) a length $D_l$ of the longest edge in each triangle $T_l$ with $l \in S_1$,
   b) a smallest angle $\alpha_{min,l}$ in each triangle $T_l$ with $l \in S_1$,
   c) a largest angle in each triangle $T_l$ with $l \in S_1$,
   d) a radius $r_{min,l}$ of a circle inscribed in each triangle $T_l$ with $l \in S_1$,
   e) a radius $r_{max,l}$ of a circle circumscribed around each triangle $T_l$ with $l \in S_1$, or
   f) a quality index $q_l$ given by $q_l = r_{min,l}/r_{max,l}$ for each triangle $T_l$ with $l \in S_1$.

3) A thyristor according to one of the previous items, characterized in that the first subset comprises only triangles located within a circle C with a diameter $d_C$ circumscribing the gate electrode.

4) A thyristor according to one of the previous items, characterized in that the first subset comprises only triangles located within a circle C', said circle C' being concentric to C and having a diameter $d_{C'}$ with $d_{C'} > 0.75 d_C$, preferably $d_{C'} > 0.9 d_C$.

5) A thyristor according to one of the previous items, characterized in that the number of triangles in the first subset is larger than 1000, preferably larger than 2000.

6) A thyristor, in particular a phase control thyristor, comprising:
   a) a semiconductor slab, in particular a semiconductor waver or die, in which a thyristor (100, 100') structure has been formed,
   b) a cathode metallization (114) formed on a cathode region on a cathode side (102) surface of the semiconductor slab,
   c) a gate metallization (118) formed on a gate region on the cathode side surface of the semiconductor slab,
   d) a plurality of N discrete emitter shorts (128), arranged at points $P_i$ in the cathode region, said points having point locations $x_i$, with $i \in \{1; \ldots; N\}$,
   e) the points $P_i$ defining a Delaunay triangulation comprising a plurality of triangles $T_j$ with $j \in \{1; \ldots; M\}$, characterized in that
   f) for a first subset of points $P_l$ with $l \in S_1 \subseteq \{1; \ldots; N\}$,
   g) with each point $P_l$ being characterized by a geometric quantity having values $q_{P,l}$ with $l \in S_1 \subseteq \{1; \ldots; N\}$, said geometric quantity having a mean value $\mu$, and
      i) a coefficient of variation of the values $q_{P,l}$ with $l \in S_1$ is smaller than 0.1, preferably smaller than 0.05, and/or
      ii) a skewedness of the geometric quantities $q_{P,l}$ with $l \in S_1$ is smaller than 5, preferably smaller than 1, and/or
      iii) a Kurtosis of the geometric quantities $q_{P,l}$ with $l \in S_1$ is smaller than 20, preferably smaller than 10, and/or
      iv) for a second subset of triangles $T_m$ with $m \in S_2 \subset S_1$ for which the respective geometric quantities $q_{P,m}$ with $m \in S_2$ deviate from the mean value by more than a predetermined amount,
         (1) a quotient of a standard deviation of the quantities $q_{P,m}$ with $m \in S_2$ and a mean squared values of the geometric quantity $q_{P,l}$ with $l \in S_1 \subseteq \{1; \ldots; N\}$ is less than 1, preferably less than 0.1, and/or
         (2) a quotient of a number of triangles in the second subset and a number of triangles in the first subset is less than $1.0 \times 10^{-2}$, preferably less than $0.5 \times 10^{-3}$.

7) A thyristor according to item 6, characterized in that for all points in the first subset, the geometric quantities $q_{T,l}$ are defined as either
   a) a number $N_{edges,l}$ of edges connected to each point $P_l$ with $l \in S_1$,
   b) a number $N_{triangles,l}$ of triangles sharing each point $P_l$ with $l \in S_1$,
   c) a length $l_{min,l}$ of a shortest edge connected to each point $P_l$ with $l \in S_1$,
   d) a length $l_{max,l}$ of a longest edge connected to each point $P_l$ with $l \in S_1$, or
   e) a Volume $V_l$ of Voronoi cell associated with each point $P_l$ with $l \in S_1$.

8) A thyristor according to one of items 6 or 7, characterized in that the first subset comprises only triangles located within a circle C with a diameter $d_C$ circumscribing the gate electrode.

9) A thyristor according to one of items 6 through 8, characterized in that the first subset comprises only points located within a circle C', said circle C' being concentric to C and having a diameter $d_{C'}$ with $d_{C'} > 0.75 d_C$, preferably $d_{C'} > 0.9 d_C$.

10) A thyristor according to one of items 6 through 9, characterized in that the number of points in the first subset is larger than 1000, preferably larger than 2000.

11) A method for manufacturing a thyristor, in particular a phase control thyristor, the method comprising the steps of
   a) forming a thyristor structure in a semiconductor slab, in particular a semiconductor wafer or die,
   b) defining a cathode region on cathode side surface (102) of the semiconductor slab,
   c) defining a shorts region as a subregion of the cathode region,
   d) determining, by means of a meshing algorithm, a surface mesh (910) within the shorts region, said surface mesh comprising a plurality of points $P_i$ with $i \in \{1; \ldots; N\}$,
   e) forming a discrete emitter short at a location of each point $P_i$ with $i \in \{1; \ldots; N\}$, and
   f) forming a cathode metallization on the cathode region.

12) A method for manufacturing a thyristor, in particular a phase control thyristor, the method comprising the steps of
   a) forming a thyristor structure in a semiconductor slab, in particular a semiconductor wafer or die,
   b) defining a cathode region on cathode side surface (102) of the semiconductor slab,
   c) defining a shorts region as a subregion of the cathode region,
   d) determining, by means of a meshing algorithm, a surface mesh (910) within the shorts region, said surface mesh comprising a plurality of cells $C_j$, with each cell delimited by a plurality of edges $e_{jk}$ with $j \in \{1; \ldots; M\}$ and $k \in \{1; 2; 3; \ldots\}$,
   e) forming a discrete emitter short at one location within each cell or at one location on each edge, and
   f) forming a cathode metallization on the cathode region.

13) The method according to one of items 11 or 12, characterized in that the meshing algorithm is a Delaunay technique algorithm.

14) The method according to one of items 11 through 13, characterized in that the meshing algorithm is based on an advancing front method.
15) The method according to one of items 11 through 14, characterized in that a minimum distance $d_{gate}$ between the gate region and the shorts region, in particular a minimum distance $d_{gate}$ between any parallel segments of the gate region and a boundary of the shorts region, respectively, is greater than a predetermined distance $D_{gate}$.

LIST OF REFERENCE SIGNS 100 phase controlled thyristor
100' phase controlled thyristor with main and auxiliary transistors
102 cathode side
104 anode side
106 ($n^+$)-doped cathode emitter layer
108, 108' p-doped base layer
110 n-doped base layer
112 p-doped anode layer
114 cathode metallization
116 anode metallization
118 gate metallization
120 auxiliary thyristor
121 additional shorts
122 additional ($n^+$)-doped cathode emitter of auxiliary thyristor
124 additional cathode metallization of auxiliary thyristor
126 main thyristor
128 emitter shorts
130 gate of auxiliary thyristor
300 process mask
304 mask short location
306 mask gate region
310 mask region close to main gate beam
312 mask region close to middle line
314 middle line
316 main gate beam location in mask
318 pilot gate region in mask
330 exemplary region where two or more subregions adjoin
400 exemplary polygon
401 gate region boundary
411 inner boundary of the cathode region
412 outer boundary of the cathode region
421 inner envelope of emitter shorts distribution
422 outer envelope of emitter shorts distribution

The invention claimed is:
1. A thyristor comprising:
a) a semiconductor slab, in which a thyristor structure is formed,
b) a cathode metallization formed on a cathode region on a cathode side surface of the semiconductor slab,
c) a gate metallization formed on a gate region on the cathode side surface of the semiconductor slab,
d) a plurality of N discrete emitter shorts, arranged at points $P_i$ in the cathode region, said points having point locations $x_i$, with $i \in \{1; \ldots ; N\}$,
e) the points $P_i$ being defined by a Delaunay triangulation comprising a plurality of triangles $T_j$ with $j \in \{1; \ldots ; M\}$, wherein
f) for a first subset of triangles $T_l$ with $l \in S_1 \subseteq \{1; \ldots ; M\}$, or $S_1 = \{1; \ldots ; M\}$,
g) with each triangle $T_l$ being characterized by a geometric quantity having values $q_{T,l}$ with $l \in S_1 \subseteq \{1; \ldots ; M\}$, said geometric quantity having a mean value μ, and
i) a coefficient of variation of the values $q_{T,l}$ with $l \in S_1$ is smaller than 0.1, and/or
ii) an absolute value of a skewedness of the geometric quantities $q_{T,l}$ with $l \in S_1$ is smaller than 5, and/or
iii) a Kurtosis of the geometric quantities $q_{T,l}$ with $l \in S_1$ is smaller than 20, and
h) for a second subset of triangles $T_m$ with $m \in S_2 \subset S_1$, for which the respective geometric quantities $q_{T,m}$ with $m \in S_2$ deviate from the mean value by more than 30%,
(1) a quotient of a standard deviation of the quantities $q_{T,m}$ with $m \in S_2$ and a mean squared value of the geometric quantity $q_{T,l}$ with $l \in S_1$ is less than 1, and/or
(2) a quotient of a number of triangles in the second subset and a number of triangles in the first subset is less than $1.0 \times 10^{-2}$.
2. The thyristor according to claim 1, wherein
h) the coefficient of variation of the values $q_{T,l}$ with $l \in S_1$ is larger than 0.0001, and/or
i) the absolute value of the skewedness of the geometric quantities $q_{T,l}$ with $l \in S_1$ is larger than 0.0001, and/or
j) the Kurtosis of the geometric quantities $q_{T,l}$ with $l \in S_1$ is larger than 3.0001, and/or
k) for the second subset of triangles $T_m$ with $m \in S_2 \subset S_1$, for which the respective geometric quantities $q_{T,m}$ with $m \in S_2$ deviate from the mean value by more than 30%,
(1) the quotient of a standard deviation of the quantities $q_{T,m}$ with $m \in S_2$ and a mean squared value of the geometric quantity $q_{T,l}$ with $l \in S_1$ is larger than 0.0001, and/or
(2) the quotient of a number of triangles in the second subset and a number of triangles in the first subset is larger than $10^{-6}$.
3. The thyristor according to claim 1, wherein for all triangles in the first subset, the geometric quantity $q_{T,l}$ is defined as either
a) a length $D_l$ of the longest edge in each triangle $T_l$ with $l \in S_1$,
b) a smallest angle $\alpha_{min,l}$ in each triangle $T_l$ with $l \in S_1$,
c) a largest angle in each triangle $T_l$ with $l \in S_1$,
d) a radius $r_{min,l}$ of a circle inscribed in each triangle $T_l$ with $l \in S_1$,
e) a radius $r_{max,l}$ of a circle circumscribed around each triangle $T_l$ with $l \in S_1$, or
f) a quality index $q_l$ given by $q_l = r_{min,l}/r_{max,l}$ for each triangle $T_l$ with $l \in S_1$.
4. A thyristor comprising:
a) a semiconductor slab in which a thyristor structure has been formed,
b) a cathode metallization formed on a cathode region on a cathode side surface of the semiconductor slab,
c) a gate metallization formed on a gate region on the cathode side surface of the semiconductor slab,
d) a plurality of N discrete emitter shorts, arranged at points $P_i$ in the cathode region, said points having point locations $x_i$, with $i \in \{1; \ldots ; N\}$,
e) the points $P_i$ defining a Delaunay triangulation comprising a plurality of triangles $T_j$ with $j \in \{1; \ldots ; M\}$, wherein
f) for a first subset of points $P_l$ with $l \in S_1 \subseteq \{1; \ldots ; N\}$, in particular $S_1 = \{1; \ldots ; N\}$,
g) with each point $P_l$ being characterized by a geometric quantity having values $q_{P,l}$ with $l \in S_1 \subseteq \{1; \ldots ; N\}$, said geometric quantity having a mean value μ, and i) a coefficient of variation of the values $q_{P,l}$ with $l \in S_1$ is smaller than 0.1, and/or ii) an absolute value of a skewedness of the geometric quantities $q_{P,l}$ with $l \in S_1$ is smaller than 5, and/or iii) a Kurtosis of the geometric quantities $q_{P,l}$ with $l \in S_1$ is smaller than 20, and h) for a second subset of points $P_m$ with $m \in S_2 \subseteq S_1$ for which the respective geometric quantities $q_{P,m}$ with $m \in S_2$ deviate from the mean value by more than 30%, (1) a quotient of a standard deviation of the quantities $q_{P,m}$ with $m \in S_2$ and a mean squared values of the geometric quantity $q_{P,l}$ with $l \in S_1 \subseteq \{1; \ldots; N\}$ is less than 1, and/or (2) a quotient of a number of points in the second subset and a number of triangles in the first subset is less than $1.0 \times 10^{-2}$.

5. The thyristor according to claim 4, wherein i) the coefficient of variation of the values $q_{P,l}$ with $l \in S_1$ is larger than 0.0001, and/or ii) the absolute value of the skewedness of the geometric quantities $q_{P,l}$ with $l \in S_1$ is larger than 0.0001, and/or iii) the Kurtosis of the geometric quantities $q_{P,l}$ with $l \in S_1$ is larger than 3.0001, and h) for the second subset of points $P_m$ with $m \in S_2 \subset S_1$, for which the respective geometric quantities $q_{P,m}$ with $m \in S_2$ deviate from the mean value by more than 30%, (1) the quotient of a standard deviation of the quantities $q_{P,m}$ with $m \in S_2$ and a mean squared value of the geometric quantity $q_{P,l}$ with $l \in S_1$ is larger than 0.0001, and/or (2) the quotient of a number of points in the second subset and a number of triangles in the first subset is larger than $10^{-6}$.

6. The thyristor according to claim 4, wherein for all points in the first subset, the geometric quantities $q_{T,l}$ are defined as either a) a number $N_{edges,l}$ of edges connected to each point $P_l$ with $l \in S_1$, b) a number $N_{triangles,l}$ of triangles sharing each point $P_l$ with $l \in S_1$, c) a length $l_{min,l}$ of a shortest edge connected to each point $P_l$ with $l \in S_1$, d) a length $l_{max,l}$ of a longest edge connected to each point $P_l$ with $l \in S_1$, or e) a Volume $V_l$ of Voronoi cell associated with each point $P_l$ with $l \in S_1$.

7. The thyristor according to claim 1, wherein a turn function difference TFD1 between an outer boundary of the cathode region and an outer envelope of the emitter shorts distribution, which is a smallest contour enclosing all emitter short locations in the cathode region, wherein TDF1 being defined as $$TFD1 = \frac{\int |\Theta_{cathode,outer} - \Theta_{env,outer}| ds}{2\pi \int_{cathode,outer} ds}$$

with $\Theta_{cathode,outer}$ being a turn function of the outer cathode region boundary and $\Theta_{env,outer}$ being a turn function of the outer envelope of the emitter shorts distribution and/or a turn function difference between an inner envelope of the emitter shorts distribution and an outer boundary of the gate region is less than 0.15 and larger than $10^{-4}$.

8. The thyristor according to claim 1, wherein the first subset comprises all points or all triangles located within a circle C with a diameter $d_C$ circumscribing the gate electrode, which diameter $d_C$ is smaller than a diameter $d_{wafer}$ of the slab or 0.75 $d_{wafer}$, or within a minimal circle $C_{min}$, which is a circle with a minimum diameter $d_{C,\,min}$ circumscribing the gate electrode.

9. The thyristor according to claim 8, wherein the first subset comprises all points or all triangles located within a circle C', said circle C' being concentric to C or $C_{min}$ and having a diameter $d_{C'}$ with $d_{C'} > 0.75\, d_C$.

10. The thyristor according to claim 1, wherein the number of points or the number of triangles in the first subset is larger than 250.

11. The thyristor according to claim 1, wherein the number of points or of triangles in the first subset is larger than 0.8 N.

12. The thyristor according to claim 1, wherein a coefficients of variation of the distance $d_{closest}$ between any given point on the boundary and the location of the emitter short closest to said point over the inner boundary and/or the outer boundary of the cathode region of less than 0.2.

13. The thyristor according to claim 1, wherein the Delaunay triangulation is a restricted Delaunay triangulation on the cathode region.

14. The thyristor according to claim 1, wherein for all triangles in the first subset, the geometric quantity $q_{T,l}$ is defined as either a) a length $D_l$ of the longest edge in each triangle $T_l$ with $l \in S_1$, b) a smallest angle $\alpha_{min,l}$ in each triangle $T_l$ with $l \in S_1$, c) a largest angle in each triangle $T_l$ with $l \in S_1$, d) a radius $r_{min,l}$ of a circle inscribed in each triangle $T_l$ with $l \in S_1$, e) a radius $r_{max,l}$ of a circle circumscribed around each triangle $T_l$ with $l \in S_1$, or f) a quality index $q_l$ given by $q_l = r_{min,l}/r_{max,l}$ for each triangle $T_l$ with $l \in S_1$.

15. The thyristor according to claim 5, wherein for all points in the first subset, the geometric quantities $q_{T,l}$ are defined as either a) a number $N_{edges,l}$ Of edges connected to each point $P_l$ with $l \in S_1$, b) a number $N_{triangles,l}$ Of triangles sharing each point $P_l$ with $l \in S_1$, c) a length $l_{min,l}$ of a shortest edge connected to each point $P_l$ with $l \in S_1$, d) a length $l_{max,l}$ of a longest edge connected to each point $P_l$ with $l \in S_1$, or e) a Volume $V_l$ of Voronoi cell associated with each point $P_l$ with $l \in S_1$.

16. The thyristor according to claim 1, wherein:

i) the coefficient of variation of the values $q_{T,l}$ with $l \in S_1$ is smaller than 0.05, and/or ii) the absolute value of a skewedness of the geometric quantities $q_{T,l}$ with $l \in S_1$ is smaller than 1, and/or iii) the Kurtosis of the geometric quantities $q_{T,l}$ with $l \in S_1$ is smaller than 10, and h) for the second subset of triangles $T_m$ with $m \in S_2 \subset S_1$, for which the respective geometric quantities $q_{T,m}$ with $m \in S_2$ deviate from the mean value by more than 30%, (1) the quotient of a standard deviation of the quantities $q_{T,m}$ with $m \in S_2$ and a mean squared value of the geometric quantity $q_{T,l}$ with $l \in S_1$ is less than 0.1, and/or (2) the quotient of a number of triangles in the second subset and a number of triangles in the first subset is less than $0.5 \times 10^{-3}$.

17. The thyristor according to claim 1, wherein:
h) the coefficient of variation of the values $q_{T,l}$ with $l \in S_1$ is larger than 0.01, and/or
i) the absolute value of the skewedness of the geometric quantities $q_{T,l}$ with $l \in S_1$ is larger than 0.01, and/or
k) for the second subset of triangles $T_m$ with $m \in S_2 \subset S_1$, for which the respective geometric quantities $q_{T,m}$ with $m \in S_2$ deviate from the mean value by more than 30%,
   (1) the quotient of a standard deviation of the quantities $q_{T,m}$ with $m \in S_2$ and a mean squared value of the geometric quantity $q_{T,l}$ with $l \in S_1$ is larger than 0.01, and/or
   (2) the quotient of a number of triangles in the second subset and a number of triangles in the first subset is larger than 0.0001.

18. The thyristor according to claim 8, wherein the first subset comprises all points or all triangles located within a circle C', said circle C' being concentric to C or $C_{min}$ and having a diameter $d_C'$ with $d_C' > 0.9\ d_C$.

19. The thyristor according to claim 1, wherein the number of points or the number of triangles in the first subset is larger than 1000.

\* \* \* \* \*

UNITED STATES PATENT AND TRADEMARK OFFICE
CERTIFICATE OF CORRECTION

PATENT NO. : 10,355,117 B2  
APPLICATION NO. : 15/421128  
DATED : July 16, 2019  
INVENTOR(S) : Marco Bellini and Jan Vobecky Page 1 of 1

It is certified that error appears in the above-identified patent and that said Letters Patent is hereby corrected as shown below:

In the Claims

Column 23 Claim 7, Line 60, replace "□" with "Θ"

Column 23 Claim 7, Line 61, replace "□" with "Θ"

Column 24 Claim 14, Line 26, replace "1" with "2"

Signed and Sealed this  
Nineteenth Day of November, 2019

Andrei Iancu  
*Director of the United States Patent and Trademark Office*